US012787624B2

(12) United States Patent
Yang et al.

(10) Patent No.: US 12,787,624 B2
(45) Date of Patent: Nov. 3, 2026

(54) MITIGATION OF VISUAL DEFECT IN A DISPLAY

(71) Applicant: QUALCOMM Incorporated, San Diego, CA (US)

(72) Inventors: Min-Lun Yang, Miaoli County (TW); Shiang-Chi Lin, Taoyuan (TW); Yi-Fan Su, Hsin Chu County (TW); Shaojui Li, Hsinchu (TW); Wei-Hsiang Weng, Hsin-Chu (TW); Chin-Jen Tseng, Fremont, CA (US); Chia-Wei Yang, Hsinchu (TW)

(73) Assignee: QUALCOMM Incorporated, San Diego, CA (US)

( * ) Notice: Subject to any disclaimer, the term of this patent is extended or adjusted under 35 U.S.C. 154(b) by 360 days.

(21) Appl. No.: 18/421,904

(22) Filed: Jan. 24, 2024

(65) Prior Publication Data

US 2025/0241191 A1 Jul. 24, 2025

(51) Int. Cl.
*H10K 59/88* (2023.01)
*G06V 40/13* (2022.01)
*H10K 59/38* (2023.01)
*H10K 59/80* (2023.01)

(52) U.S. Cl.
CPC ......... *H10K 59/88* (2023.02); *G06V 40/1306* (2022.01); *H10K 59/873* (2023.02); *H10K 59/8792* (2023.02); *H10K 59/38* (2023.02)

(58) Field of Classification Search
CPC .. H10K 59/88; H10K 59/873; H10K 59/8792; H10K 59/38; G06V 40/1306; G06F 1/1637; G06F 1/1684
USPC ............................................................ 257/40
See application file for complete search history.

(56) References Cited

U.S. PATENT DOCUMENTS

2019/0205596 A1* 7/2019 Kim .................... G06V 40/1306
2020/0234021 A1 7/2020 Lu et al.
2021/0120691 A1 4/2021 Su et al.
2021/0200366 A1* 7/2021 Bok .......................... H04R 7/04
2021/0326557 A1 10/2021 Lee et al.
(Continued)

FOREIGN PATENT DOCUMENTS

CN 115641619 A 1/2023

OTHER PUBLICATIONS

International Search Report and Written Opinion—PCT/US2024/059219—ISA/EPO—Mar. 7, 2025.

*Primary Examiner* — Tong-Ho Kim
(74) *Attorney, Agent, or Firm* — Weaver Austin Villeneuve & Sampson LLP-QUAL

(57) ABSTRACT

Various configurations of a display apparatus to mitigate a visual defect is disclosed. Such a visual defect may include a sensor mark that indicates the presence of a sensing element disposed beneath a screen, for instance, shown as edges of a fingerprint sensor, which may be visible to a user and distractive to the user experience. Visual, mechanical, and material properties of one or more layers between the display and the sensing element may be selected to prevent formation of or reduce the visibility of the sensor mark. In some configurations, a low elastic modulus or a low light reflectance material may be used. In some cases, the material may include a black adhesive. In some configurations, a polymer-based or metal-based spacer having a specific thickness may be used. In some configurations, a polarizer layer may be included.

29 Claims, 17 Drawing Sheets

(56) References Cited

U.S. PATENT DOCUMENTS

| | | | | |
|---|---|---|---|---|
| 2022/0213358 | A1* | 7/2022 | Sahni | C08K 5/3412 |
| 2024/0023369 | A1* | 1/2024 | Liu | H10K 50/865 |

* cited by examiner

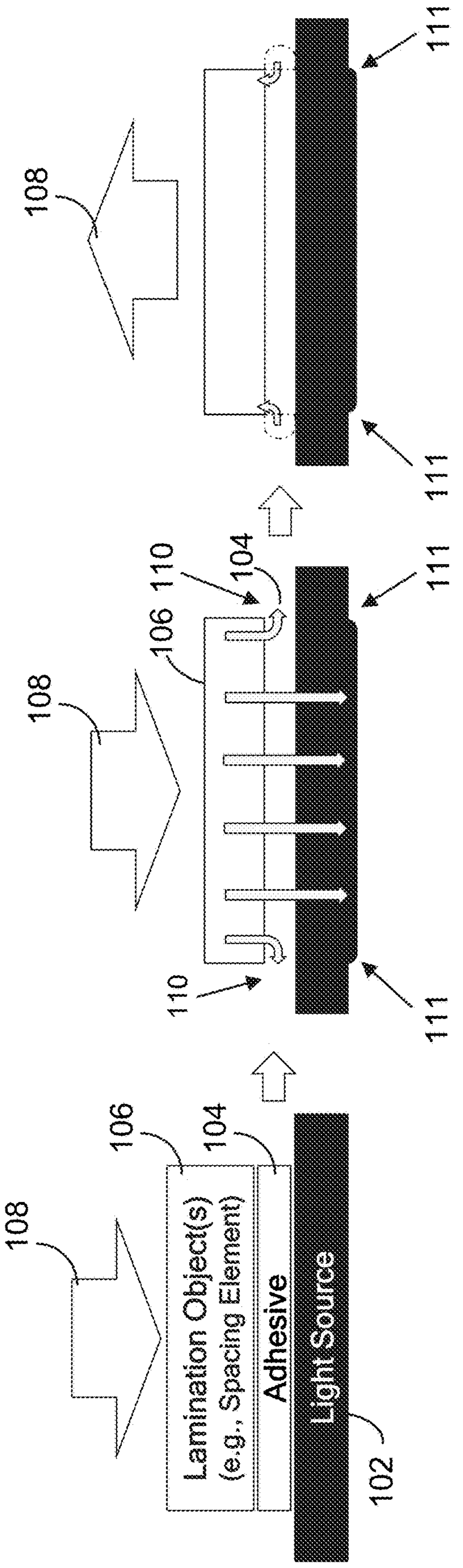
Figure 1A
Figure 1B
Figure 1C
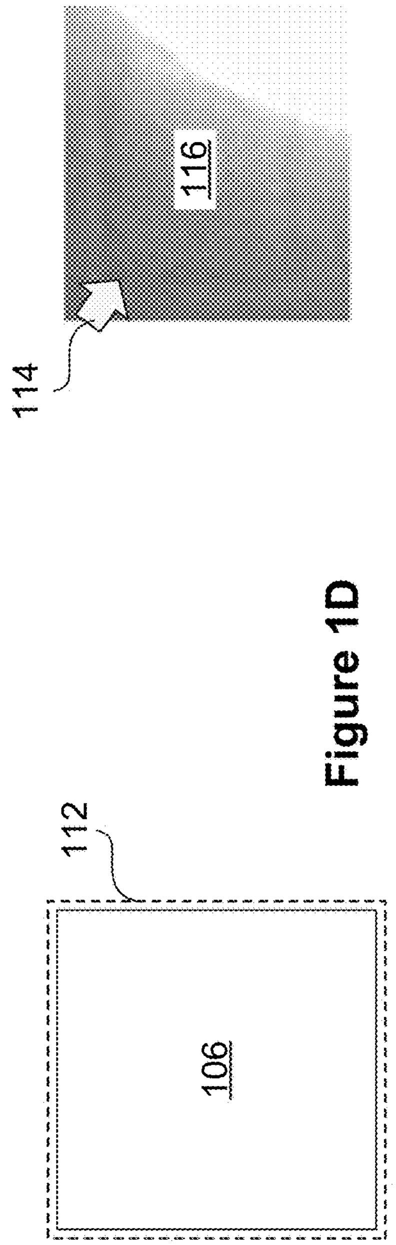
Figure 1D
Figure 1E

MITIGATION OF VISUAL DEFECT IN A DISPLAY

TECHNICAL FIELD

This disclosure relates generally to devices and systems using sensors, such as biometric sensors used in conjunction with a device.

DESCRIPTION OF RELATED TECHNOLOGY

Sensing technologies can be implemented in devices can be used for various applications, including biometric sensing as but one example. Some such devices can include, for example, a sensor that may use ultrasonic transmitter(s) configured to generate and send an ultrasonic wave through a transmissive medium (such as a transparent screen), and ultrasonic sensor(s) or array(s) configured to detect ultrasonic waves reflected from an object (such as a finger). However, the presence of the sensor may become unintentionally revealed to a user of the device through the transmissive medium, resulting in a visually distracting experience.

SUMMARY

The systems, methods and devices of this disclosure each have several aspects, no single one of which is solely responsible for the desirable attributes disclosed herein.

In one aspect of the present disclosure, display apparatus is disclosed. The display apparatus may include: a light source; a sensing element; and one or more spacing elements arranged between the light source and the sensing element, at least one of the one or more spacing elements including a first pressure sensitive adhesive (PSA) layer having a thickness between 25 and 150 μm and a light reflectance below 10%.

In some implementations, the sensing element may include a fingerprint sensor configured to obtain fingerprint data through a transparent layer associated with the light source, and an operation by a device implementing the display apparatus is associated with the fingerprint data.

In some implementations, the first PSA layer may include a black PSA layer having a shade of black. In some cases, the black PSA layer may be colored via use of via use of a black dye, a black powder, or a black paint to produce the shade of black.

In some implementations, the light source may include an organic light-emitting diode (OLED). In some cases, the OLED may include a Color Filter on Encapsulation OLED (COE OLED), and the one or more spacing elements may include a polarizer layer configured to be used with the COE OLED.

In another aspect of the present disclosure, another display apparatus is disclosed. The display apparatus may include: a light source; a sensing element; and one or more spacing elements arranged between the light source and the sensing element, at least one of the one or more spacing elements including an optical clear adhesive (OCA) layer or an optical clear resin (OCR) layer, the OCA layer or the OCR layer having an elastic modulus of up to 0.2 megapascals (MPa) and a thickness between 25 and 300 μm.

In another aspect of the present disclosure, another display apparatus is disclosed. The display apparatus may include: a light source; a sensing element; and a plurality of spacing elements arranged between the light source and the sensing element, the plurality of spacing elements including: a pressure sensitive adhesive (PSA) layer; a polymer-based spacing element adjacent to the PSA layer, the polymer-based spacing element having a thickness between 25 and 300 μm; and a copper-based double-sided tape (DST) layer adjacent to the polymer-based spacing element.

In another aspect of the present disclosure, another display apparatus is disclosed. The display apparatus may include: a light source; a sensing element; and one or more spacing elements arranged between the light source and the sensing element, at least one of the one or more spacing elements including a first pressure sensitive adhesive (PSA) layer having a thickness between 25 and 150 μm.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

FIGS. 1A-1C show an example sequence of how a visual defect associated with hardware of a device may occur.

FIGS. 1D and 1E show examples of a defect (such as a sensor mark) that may become visible as a result of the sequence of FIGS. 1A-1C.

Like reference numbers and designations in the various drawings indicate like elements.

DETAILED DESCRIPTION

Figure 1F:
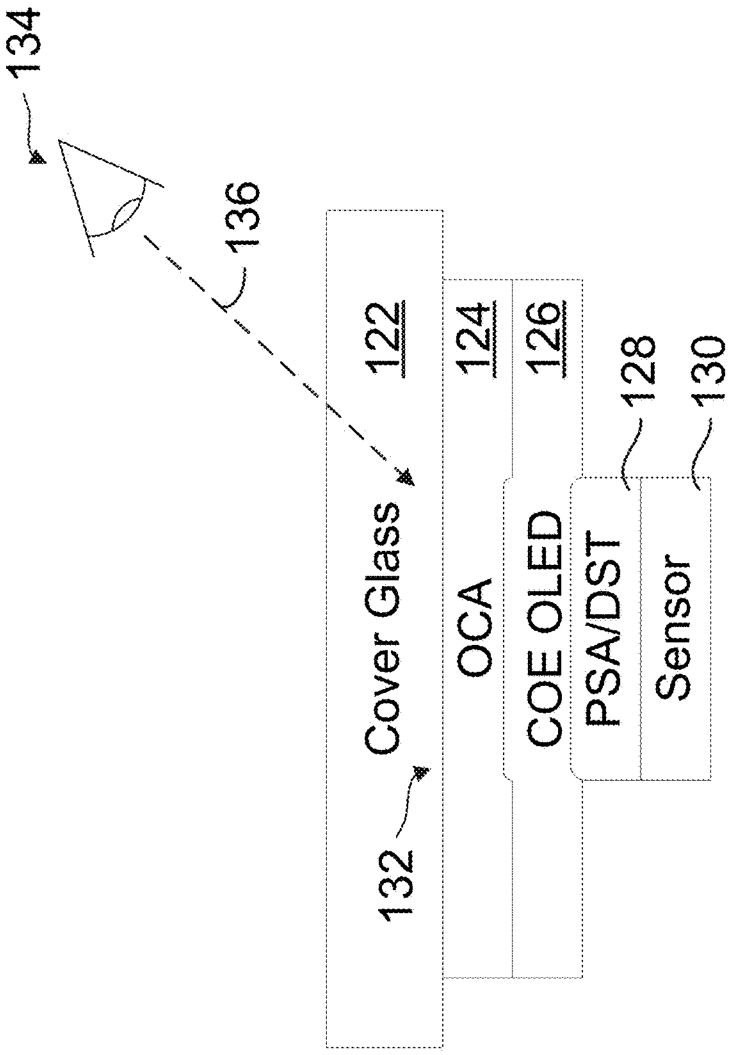
FIG. 1F shows a block diagram representing some example components of a device that implements Color Filter on Encapsulation (COE) organic light-emitting diode (OLED).

The following description is directed to certain implementations for the purposes of describing various aspects of this disclosure. However, a person having ordinary skill in the art will readily recognize that the teachings herein can be applied in a multitude of different ways. Some of the concepts and examples provided in this disclosure are especially applicable to blood pressure monitoring applications or monitoring of other physiological parameters. However, some implementations also may be applicable to other types of biological sensing applications, as well as to other fluid flow systems. The described implementations may be implemented in any device, apparatus, or system that includes an apparatus as disclosed herein. In addition, it is contemplated that the described implementations may be included in or associated with a variety of electronic devices such as, but not limited to: mobile telephones, multimedia Internet enabled cellular telephones, mobile television receivers, wireless devices, smartphones, smart cards, wearable devices such as bracelets, armbands, wristbands, rings, headbands, patches, chest bands, anklets, etc., Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players, game consoles, wrist watches, clocks, calculators, television monitors, flat panel displays, electronic reading devices (such as e-readers), mobile health devices, computer monitors, auto displays (including odometer and speedometer displays, etc.), cockpit controls and/or displays, camera view displays (such as the display of a rear view camera in a vehicle), architectural structures, microwaves, refrigerators, stereo systems, cassette recorders or players, DVD players, CD players, VCRs, radios, portable memory chips, washers, dryers, washer/dryers, parking meters, automobile doors, Internet of Things (IoT) devices, etc. Thus, the teachings are not intended to be limited to the specific implementations depicted and described with reference to the drawings; rather, the teachings have wide applicability as will be readily apparent to a person having ordinary skill in the art.

Modern devices include various functionalities and hardware that supports the functionalities. As but one example, fingerprint sensing using a sensor is one such function of a device. Fingerprint data obtained using a fingerprint sensor may be used by the device to identify an object (such as a finger or fingerprint), change an operative state of the device, and/or activate other functions of the device (unlock or lock the device, initialize an application, authenticate a user, etc.). Some devices may be configured such that the sensor (such as a fingerprint sensor) is disposed beneath a display, which in cases of many smart devices (smartphone, tablets, etc.) may be a screen or other user interface.

Under certain conditions, the sensor or a portion thereof (such as edges) or other hardware or apparatus may become visible to a user, such as through the screen. Visibility of underlying hardware or apparatus such as a sensor may occur over time or be caused by other causes.

Various aspects relate generally to display devices and systems, and more particularly to reducing, masking, or otherwise mitigating visual defects in display devices and systems. Some aspects more specifically relate to mitigating sensor marks, which are visually noticeable phenomena that indicate the presence of a component such as a sensor beneath a display screen or glass cover (where a user's visual attention is often placed). Sensor marks may occur through forces applied to components associated with the display device, for example, a sensor such as a fingerprint sensor close to the surface of the display screen or glass cover. Organic light-emitting diode (OLED), or in some implementations, Color Filter on Encapsulation (COE) OLED may in some cases be susceptible to sensor marks.

Sensor marks and/or their formation can be mitigated via one or more approaches, including a visual approach, a mechanical approach, or a materials approach. More particularly, in some example implementations, a pressure sensitive adhesive (PSA) having a low light reflectance (by dying it black) can visually mask the sensor mark. In some example implementations, an optical clear adhesive (OCA) or optical clear resin (OCR) having a softness or elasticity can minimize the internal stress of lamination forces of device components, thereby mitigating the formation of sensor marks over time. In some example implementations, a polymer layer, an inorganic layer, and/or a metallic layer of varying thicknesses can be used to mitigate formation of sensor marks. In some example implementations, a polarizer layer may be used, even with COE OLED. Each of these approaches may involve selecting properties such as light reflectance, elastic modulus, thickness, or type of material. Properties are selected to balance mitigation of sensor mark and maintaining sensor performance.

Particular aspects of the subject matter described in this disclosure can be implemented to realize one or more of the following potential advantages. According to implementations, by selecting certain visual, mechanical, and/or material properties of components used with a sensor and a display, the stacks of materials used with a display apparatus can be used to mask, prevent formation of, or otherwise mitigate sensor marks. A visually noticeable sensor mark can detract from user experience, as it can become distracting or contribute to a sense of defective performance or other imperfections present in the device. Mitigating sensor marks, therefore, can enhance user experience and user retention associated with the device.

FIGS. 1A-1C show an example sequence of how a visual defect associated with hardware of a device may occur. In specific examples, the visual defect may indicate the presence of a sensing element, such as edges of a fingerprint sensor disposed beneath a screen. For instance, the visual defect may be visually indicative of a boundary or a location of the sensing element through a transparent layer associated with a light source 102 (such as an OLED (organic light-emitting diode) layer). Such a phenomenon may be referred to herein as a "sensor mark." As shown in FIG. 1A, a force 108 may be applied to lamination object(s) 106 (such as layers of hardware such as a sensor element or a spacing element as will be discussed in more detail below), which may deform another layer such as an adhesive 104 or other pliable material. Such force 108 may be caused by a user's handling of the device. FIG. 1B shows a deformity 110 that occurs to the adhesive 104 upon application of the force 108, due to the flexibility and pliability of the material. The deformity 110 of the adhesive 104 may be characterized by a bulging of the material of the adhesive 104 beyond an edge or edges of the lamination object(s) 106, as shown. As shown in FIG. 1C, upon release of the force 108, the adhesive 104 returns back (or substantially returns) to its original shape deformity. However, a visual defect may result from the deformity 110 from one or more occurrences of the forces similar to the force 108. For instance, residue or traces of the material of the adhesive 104 may be left behind where the deformity 110 occurred, discoloration or an imprint may be left due to the pressure and/or stress between the adhesive 104 and the light source 102, or the adhesive 104 itself may become permanently deformed. In addition, a display apparatus such as an OLED screen used in the device may have some plasticity and not be entirely rigid. Thus, the light source 102 also may be impacted by stress and deformation 111.

A visual defect such as a sensor mark 112 associated with the lamination object(s) 106 (including a sensor) may become visible from a top-down view as a result of the aforementioned sequence, as shown in the diagram in FIG. 1D. The visibility of the sensor mark 112 may be slight, or it may be visible at a specific angle or under strong light. FIG. 1E shows an example of a sensor mark 114 (indicated by an arrow) that is visible around the sensor 116. The sensor mark 112 or 114 may ultimately and undesirably become noticeable to a user of the device during normal operation of the device or under certain viewing angles or presence of certain levels of illumination or luminance.

In particular configurations, devices implementing a Color Filter on Encapsulation (COE) OLED may omit a polarizer film to reduce the power consumption of the device. Devices without a polarizer layer may be more susceptible to sensor mark issues, and where edges of a sensor may be visible to a user under certain conditions.

FIG. 1F shows a block diagram representing some example components of a device that implements COE OLED. The components may include a cover glass 122, an optical clear adhesive (OCA) 124, a COE OLED layer 126, a pressure sensitive adhesive (PSA) or double-sided tape (DST) 128, and a sensor element 130. Notably, while typical OLED may implement a polarizer (such as between the OCA and the OLED layer), COE OLED may not use a polarizer. COE-based implementations may have substantial power savings as compared to usage of polarizers.

However, as a result, a sensor mark 132 may be present and observable, for example, as a result of a force or repeated forces (such as force 108) mentioned with respect to the aforementioned sequence shown in FIGS. 1A-IC. For instance, the sensor mark 132 may be inspectable to an observer 134 through the cover glass 122 via a line of sight 136.

While a sensor mark may not impact the functionality or performance of the sensor, it can detract from the user experience or even lead to lower user retention, as the sensor mark can become visually distracting or contribute to a sense of defective performance or other imperfections present in the device. As such, it is desirable to mitigate sensor marks and other visual defects, at least from a standpoint of improving user experience or maintaining a positive user experience.

To that end, various aspects relate generally to visual, mechanical, and materials-based solutions for mitigating visual defects relating to device hardware (such as a sensor under a display screen). In some implementations, a pressure sensitive adhesive (PSA) of various properties may be used in a stack of materials between the display screen and the sensor. In some implementations, a PSA having low light reflectance may be used, resulting in a dark or black color. In some implementations, an optical clear adhesive (OCA) layer or an optical clear resin (OCR) layer having various properties may be used in the stack of materials. In some implementations, a polymer-based spacing element may be used in the stack of materials. In some implementations, a metallic spacing element may be used in the stack of materials. In some implementations, a double-sided tape (DST) may be used in the stack of materials. In some implementations, the DST may be metal-based. Aforementioned properties may include, such as thickness, color, modulus, type of material, light reflectance, or others. In some implementations, a polarizer layer may be added to the stack of materials.

Particular implementations of the subject matter described in this disclosure can be implemented to realize one or more of the following potential advantages. Properties of the aforementioned types of layers can be selected in a combination of one or more of the above in the stack of materials to improve the sensor mark issue while maintaining an acceptable level of sensor performance. Improving the sensor mark issue would, for example, visually mask the presence of the device hardware, resulting in improved user experience.

Additional details will follow after an initial description of relevant systems and technologies.

In some implementations, an array of one or more sensor elements may be configured as an ultrasonic sensor array that is configured for ultrasonic fingerprint imaging. Thin film piezoelectric acoustic transducers are attractive candidates for numerous applications including biometric sensors, ultrasonic imaging devices, and fingerprint sensors. In some configurations, such transducers may include piezoelectric micromechanical ultrasonic transducers (PMUTs) configured as a multilayer stack that includes a piezoelectric layer stack and a mechanical layer disposed over a cavity. The piezoelectric layer stack may include a layer of piezoelectric material. In some applications, a one- or two-dimensional array of any number of PMUT sensor elements may be contemplated.

Figure 2A:
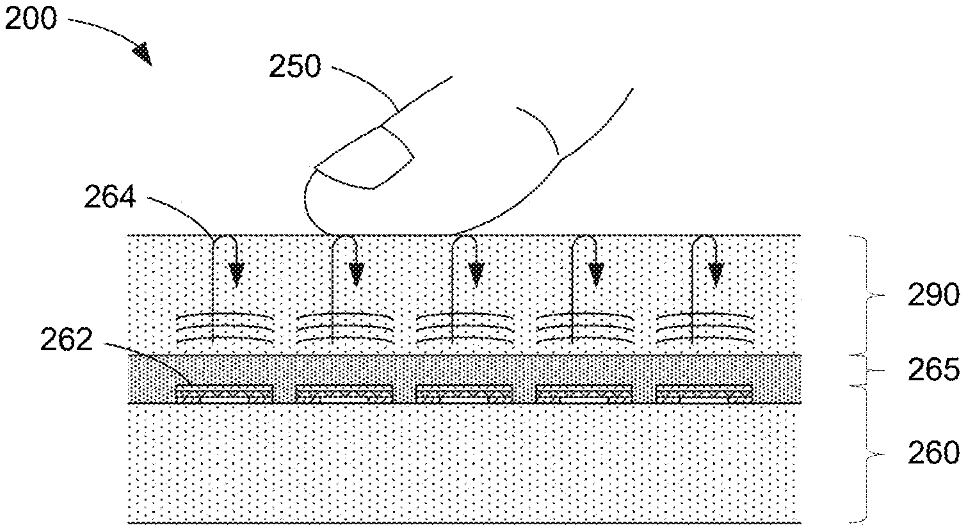
FIG. 2A shows a side view of an example configuration of an ultrasonic sensor array capable of ultrasonic imaging.

FIG. 2A illustrates a side view of an example configuration of an ultrasonic sensor array of sensor elements which is capable of ultrasonic imaging. FIG. 2A depicts an ultrasonic sensor array 200 with an array of sensor elements configured as transmitting and receiving elements that may be used for ultrasonic imaging. In some implementations, the ultrasonic sensor array 200 may be an example of or a portion of a sensor element or a sensor as discussed herein. In certain scenarios, a visual defect (such as a sensor mark) may arise from force or pressure applied to the ultrasonic sensor array 200 or portion(s) thereof.

Sensor elements 262 on a sensor array substrate 260 may emit and detect ultrasonic waves. As illustrated, an ultrasonic wave 264 may be transmitted from at one or more sensor elements 262. The ultrasonic wave 264 may travel through a propagation medium such as an acoustic coupling medium 265 and a platen 290 towards an object 250 such as a finger or a stylus positioned on an outer surface of the platen 290. A portion of the ultrasonic wave 264 may be transmitted through the platen 290 and into the object 250, while a second portion is reflected from the surface of platen 290 back towards a sensor element 262. The amplitude of the reflected wave may depend in part on the acoustic properties of the object 250 and the platen 290. The reflected wave may be detected by the sensor elements 262, from which an image of the object 250 may be acquired. For example, with sensor arrays having a pitch of about 50 microns (about 500 pixels per inch), ridges and valleys of a fingerprint may be detected. An acoustic coupling medium 265, such as an adhesive, gel, a compliant layer or other acoustic coupling material may be provided to improve coupling between an array of sensor elements 262 disposed on the sensor array substrate 260 and the platen 290. The acoustic coupling medium 265 may aid in the transmission of ultrasonic waves to and from the sensor elements 262. The platen 290 may include, for example, a layer of glass, plastic, sapphire, metal, metal alloy, or other platen material. An acoustic impedance matching layer (not shown) may be disposed on an outer surface of the platen 290. The platen 290 may include a coating (not shown) on the outer surface. In some implementations, sensor elements may be co-fabricated with thin-film transistor (TFT) circuitry or CMOS circuitry on or in the same substrate, which may be a silicon, SOI, glass or plastic substrate, in some examples. The TFT, silicon or semiconductor substrate may include row and column addressing electronics, multiplexers, local amplification stages and control circuitry.

Figure 2B:
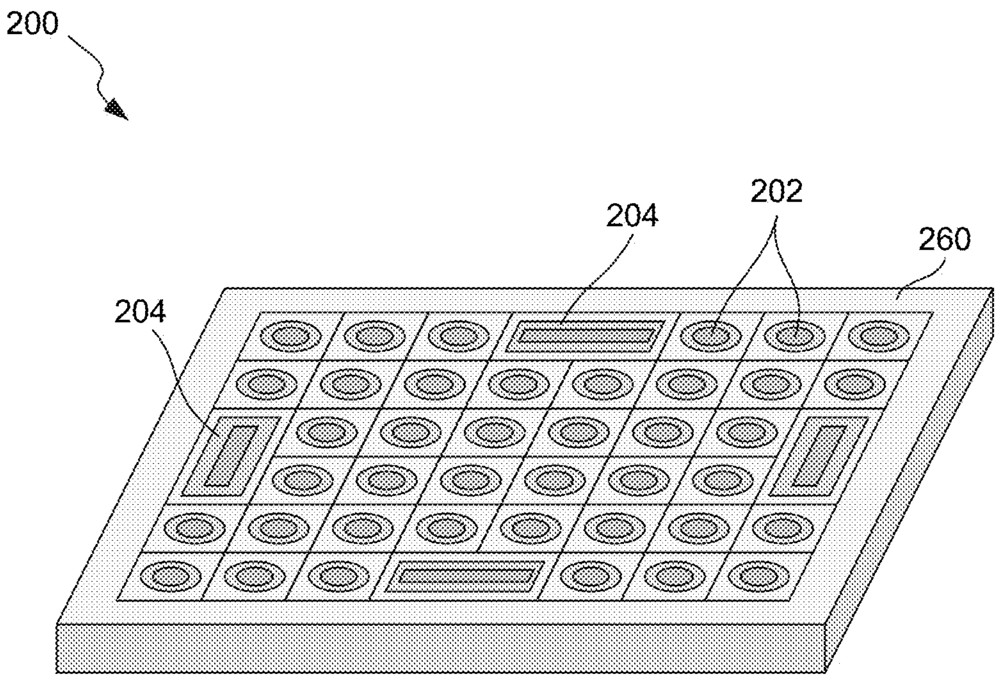
FIG. 2B shows an example configuration of ultrasonic sensor array.

FIG. 2B shows an example configuration of an ultrasonic sensor array including sensor elements 202 and sensor elements 204 formed on a substrate 260. Substrate 260 may be an example of the sensor array substrate 260 mentioned above. The sensor elements 202 are shown as circular sensor elements. In some implementations, the sensor elements 202 are not used for force detection in the non-ultrasonic force detection mode. Sensor elements 204 are larger than the sensor elements 202 and are shown as rectangular. It will be understood that these sensor elements 202, 204 may be any appropriate shape and size. In some implementations, the sensor elements 204 that are used for non-ultrasonic force detection may be larger than the sensor elements 202 that are used solely for ultrasonic imaging. The sensor elements 204, used during non-ultrasonic force detection mode to detect applied force as described above, are located on the periphery of the ultrasonic sensor array 200. By placing the sensor elements 204 used for force detection around the periphery, the ultrasonic sensor array may be used for centering detection. While only the sensor elements 204 are used for non-ultrasonic force detection, both sensor elements 202 and sensor elements 204 may be used for ultrasonic imaging as described above with respect to FIG. 2A. That is, the sensor elements 204 may initially be used to statically detect force from a finger press and then be switched to an ultrasonic mode for ultrasonic imaging in some implementations. In alternative implementations, the sensor elements 204 may be used only for force detection, with only the sensor elements 202 used for ultrasonic imaging. In some implementations, sensor elements 204 near the periphery of the ultrasonic sensor array 200 may be used for cursor, pointer or icon control, or for screen navigation on a display of a mobile device. In some implementations, some or all of sensor elements 202, 204, 262 in FIGS. 2A and 2B may be PMUT sensor elements.

Figure 3A:
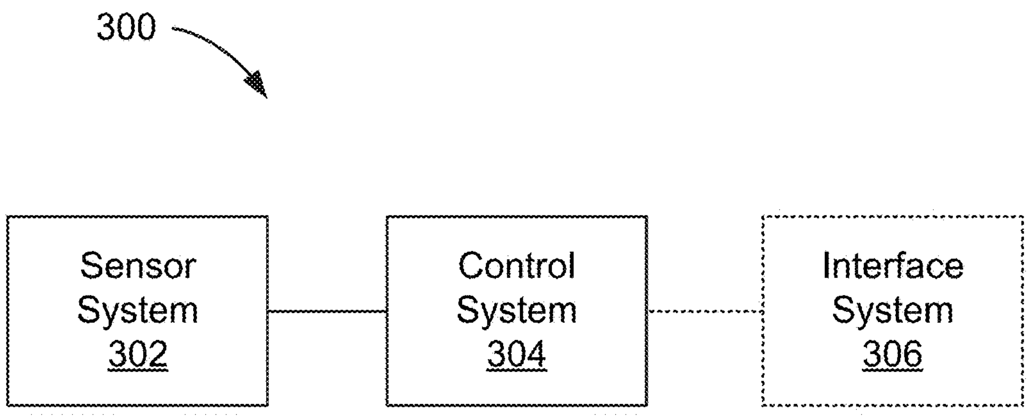
FIG. 3A shows a block diagram representation of components of an example sensing system.

An ultrasonic sensor array may be part of a sensing system of a device, for example, a mobile device. FIG. 3A shows a block diagram representation of components of an example sensing system 300. As shown, the sensing system 300 may include a sensor system 302 and a control system 304 electrically coupled to the sensor system 302. The sensor system 302 may be capable of detecting the presence of an object, for example a human finger. The sensor system 302 may be capable of scanning an object and providing raw measured image information usable to obtain an object signature, for example, a fingerprint of a human finger (such as 250). The control system 304 may be capable of controlling the sensor system 302 and processing the raw measured image information received from the sensor system. In some implementations, the sensing system 300 may include an interface system 306 capable of transmitting or receiving data, such as raw or processed measured image information, to or from various components within or integrated with the sensing system 300 or, in some implementations, to or from various components, devices or other systems external to the sensing system.

Figure 3B:
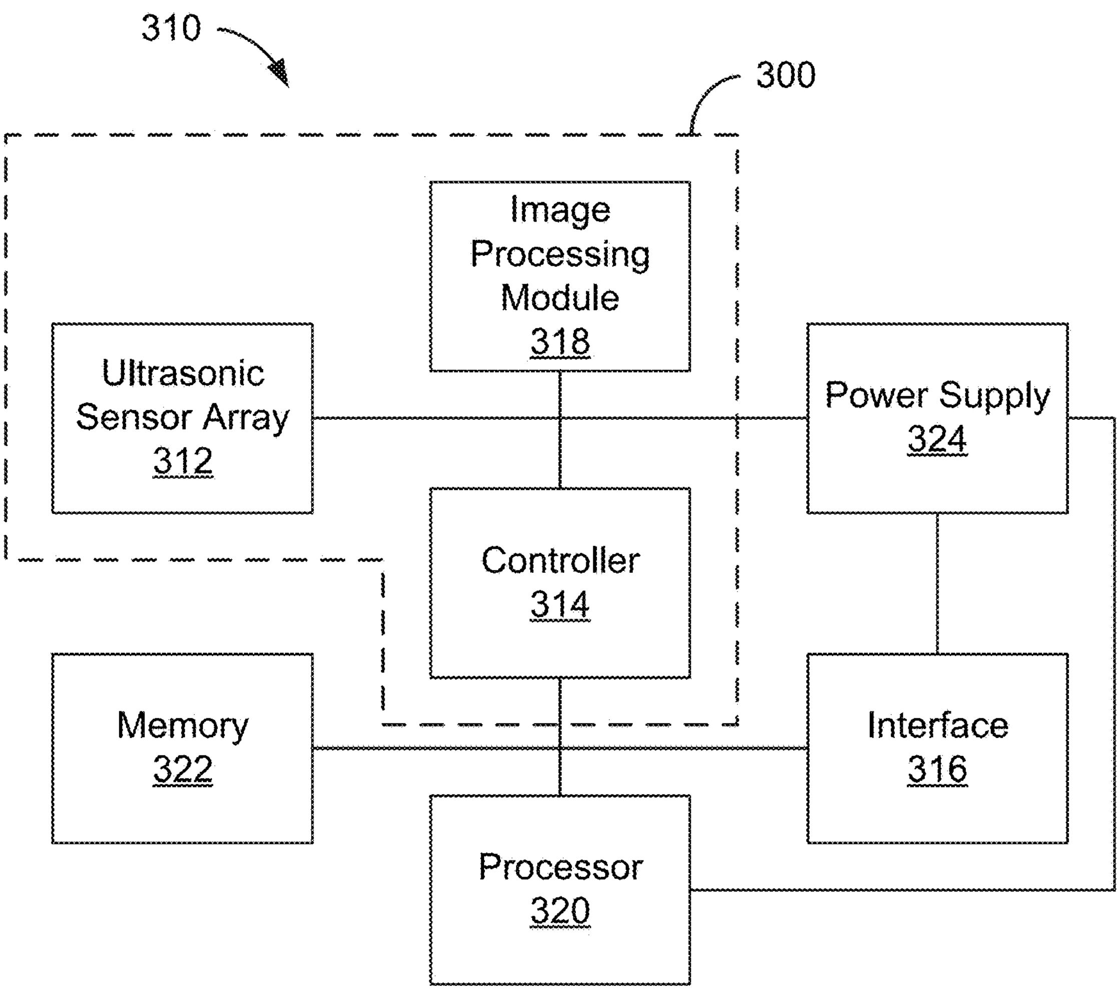
FIG. 3B shows a block diagram representation of components of an example mobile device that includes the sensing system of FIG. 3A.

FIG. 3B shows a block diagram representation of components of an example mobile device 310 that includes the sensing system 300 of FIG. 3A. The sensor system 302 of the sensing system 300 of the mobile device 310 may be implemented with an ultrasonic sensor array 312, such as the ultrasonic sensor array 200 shown in FIG. 2. The control system 304 of the sensing system 300 may be implemented with a controller 314 that is electrically coupled to the ultrasonic sensor array 312. While the controller 314 is shown and described as a single component, in some implementations, the controller 314 may collectively refer to two or more distinct control units or processing units in electrical communication with one another. In some implementations, the controller 314 may include one or more of a general purpose single- or multi-chip processor, a central processing unit (CPU), a digital signal processor (DSP), an applications processor, an application specific integrated circuit (ASIC), a field programmable gate array (FPGA) or other programmable logic device (PLD), discrete gate or transistor logic, discrete hardware components, or any combination thereof designed to perform the functions and operations described herein.

The sensing system 300 of FIG. 3B may include an image processing module 318. In some implementations, raw measured image information provided by the ultrasonic sensor array 312 may be sent, transmitted, communicated or otherwise provided to the image processing module 318. The image processing module 318 may include any suitable combination of hardware, firmware and software configured, adapted or otherwise operable to process the image information provided by the ultrasonic sensor array 312. In some implementations, the image processing module 318 may include signal or image processing circuits or circuit components including, for example, amplifiers (such as instrumentation amplifiers or buffer amplifiers), analog or digital mixers or multipliers, switches, analog-to-digital converters (ADCs), passive or active analog filters, among others. In some implementations, one or more of such circuits or circuit components may be integrated within the controller 314, for example, where the controller 314 is implemented as a system-on-chip (SoC) or a system-in-package (SIP). In some implementations, one or more of such circuits or circuit components may be integrated within a DSP included within or coupled to the controller 314. In some implementations, the image processing module 318 may be implemented at least partially via software. For example, one or more functions of, or operations performed by, one or more of the circuits or circuit components just described may instead be performed by one or more software modules executing, for example, in a processing unit of the controller 314 (such as in a general purpose processor or a DSP).

In some implementations, in addition to the sensing system 300, the mobile device 310 may include a separate processor 320 such as an applications processor, a memory 322, an interface 316 and a power supply 324. In some implementations, the controller 314 of the sensing system 300 may control the ultrasonic sensor array 312 and the image processing module 318, and the processor 320 of the mobile device 310 may control other components of the mobile device 310. In some implementations, the processor 320 may communicate data to the controller 314 including, for example, instructions or commands. In some such implementations, the controller 314 may communicate data to the processor 320 including, for example, raw or processed image information. It should also be understood that, in some other implementations, the functionality of the controller 314 may be implemented entirely, or at least partially, by the processor 320. In some such implementations, a separate controller 314 for the sensing system 300 may not be required because the functions of the controller 314 may be performed by the processor 320 of the mobile device 310.

Depending on the implementation, one or both of the controller 314 and processor 320 may store data in the memory 322. For example, the data stored in the memory 322 may include raw measured image information, filtered or otherwise processed image information, estimated PSF or estimated image information, and final refined PSF or final refined image information. The memory 322 may store processor-executable code or other executable computer-readable instructions capable of execution by one or both of the controller 314 and the processor 320 to perform various operations (or to cause other components such as the ultrasonic sensor array 312, the image processing module 318, or other modules to perform operations), including any of the calculations, computations, estimations or other determinations described herein (including those presented in any of the equations below). It should also be understood that the memory 322 may collectively refer to one or more memory devices (or "components"). For example, depending on the implementation, the controller 314 may have access to and store data in a different memory device than the processor 320. In some implementations, one or more of the memory components may be implemented as a NOR- or NAND-based Flash memory array. In some other implementations, one or more of the memory components may be implemented as a different type of non-volatile memory. Additionally, in some implementations, one or more of the memory components may include a volatile memory array such as, for example, a type of RAM.

In some implementations, the controller 314 or the processor 320 may communicate data stored in the memory 322 or data received directly from the image processing module 318 through an interface 316. For example, such communicated data can include image information or data derived or otherwise determined from image information. The interface 316 may collectively refer to one or more interfaces of one or more various types. In some implementations, the interface 316 may include a memory interface for receiving data from or storing data to an external memory such as a removable memory device. Additionally or alternatively, the interface 316 may include one or more wireless network interfaces or one or more wired network interfaces enabling the transfer of raw or processed data to, as well as the reception of data from, an external computing device, system or server.

A power supply 324 may provide power to some or all of the components in the mobile device 310. The power supply 324 may include one or more of a variety of energy storage devices. For example, the power supply 324 may include a rechargeable battery, such as a nickel-cadmium battery or a lithium-ion battery. Additionally or alternatively, the power supply 324 may include one or more supercapacitors. In some implementations, the power supply 324 may be chargeable (or "rechargeable") using power accessed from, for example, a wall socket (or "outlet") or a photovoltaic device (or "solar cell" or "solar cell array") integrated with the mobile device 310. Additionally or alternatively, the power supply 324 may be wirelessly chargeable.

As used herein, the term "processing unit" refers to any combination of one or more of a controller of an ultrasonic system (for example, the controller 314), an image processing module (for example, the image processing module 318), or a separate processor of a device that includes the ultrasonic system (for example, the processor 320). In other words, operations that are described below as being performed by or using a processing unit may be performed by one or more of a controller of the ultrasonic system, an image processing module, or a separate processor of a device that includes the sensing system.

Figure 4:
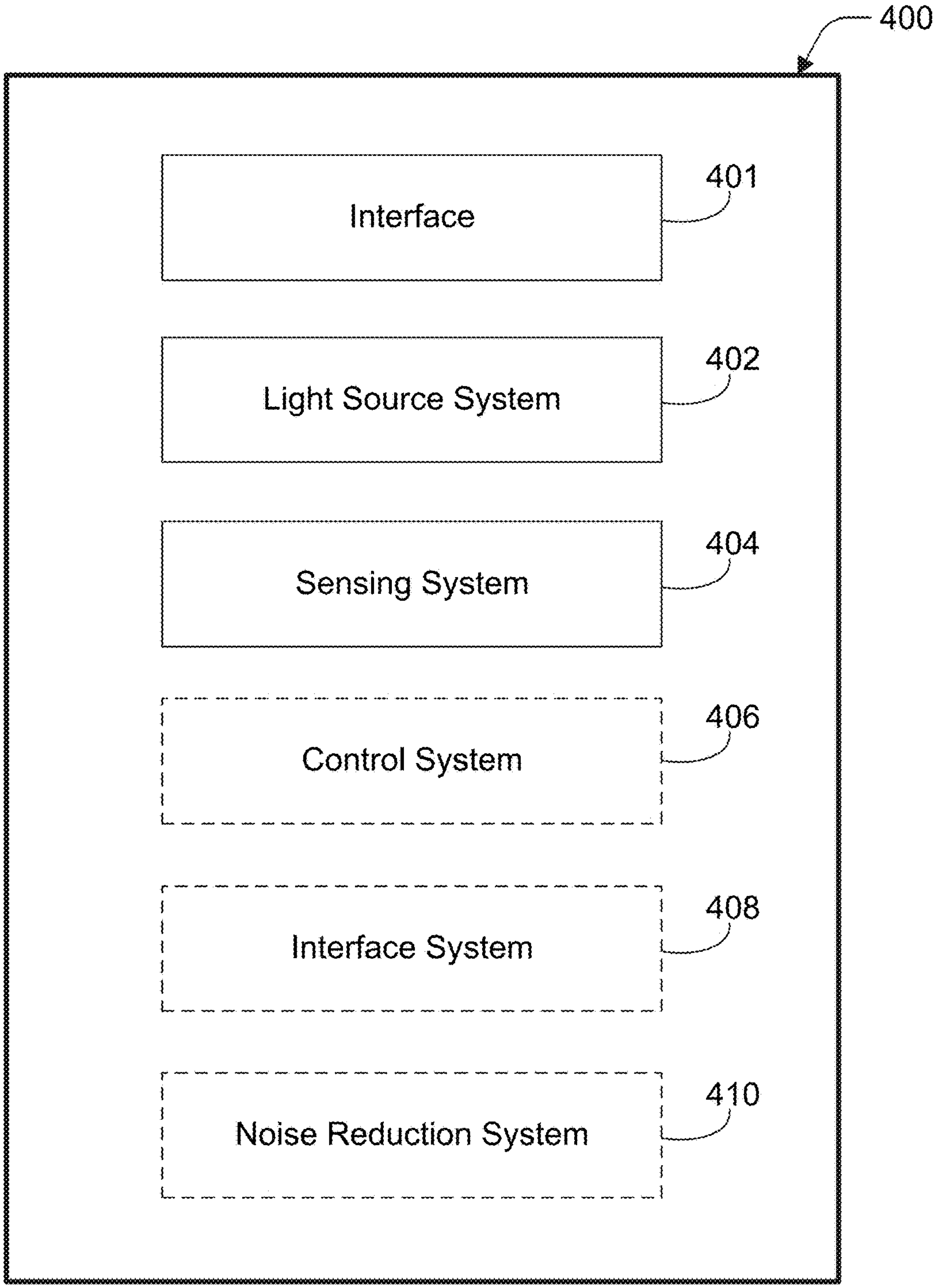
FIG. 4 shows a block diagram that shows example components of a display apparatus.

FIG. 4 shows a block diagram that shows example components of a display apparatus 400. In this example, the display apparatus 400 includes an interface 401 (such as a touchscreen), a light source system 402 (such as OLEDs), and a sensing system 404 (such as ultrasonic sensor array 200, sensor system 302, or ultrasonic sensor array 312). Some implementations of the display apparatus 400 may include a control system 406, an interface system 408, a noise reduction system 410, or a combination thereof.

In some configurations, the display apparatus 400 may be implemented with a device, such as mobile device 310. That is to say, in some implementations, components of the display apparatus 400 may operate in concert with one another. In some implementations, the light source system 402 and the sensing system 404 may be in contact with each other at least partially, either directly or via a coupling material such as an adhesive or other objects (such as one or more spacing elements).

In some implementations, the light source system 404 may, include one or more one or more light sources. In some implementations, the light source system 404 may include one or more light-emitting diodes, such as OLEDs, or in certain implementations, COE OLEDs. OLED implementing COE may achieve less power consumption for devices. Compared to COE OLED, an OLED implementing a polarizer may involve a more complex structure, which may result in higher power consumption and/or lower efficiency. However, COE OLED may increase susceptibility to sensor marks observable through a display. In some implementations, the light source system 404 may include one or more laser diodes. According to some implementations, the light source system 404 may include one or more vertical-cavity surface-emitting lasers (VCSELs). In some implementations, the light source system 404 may include one or more edge-emitting lasers. In some implementations, the light source system 404 may include one or more neodymium-doped yttrium aluminum garnet (Nd:YAG) lasers. Hence, the light source system 404 may include, for example, a laser diode, a light-emitting diode (LED, OLED), or an array of either or both.

The light source system 404 may be configured to generate and emit optical signals. The light source system 404 may, in some examples, be configured to transmit light in one or more wavelength ranges. In some examples, the light source system 404 may be configured to transmit light in the visible wavelength range, such as about 400 to 700 nanometers (nm), for user viewing. In other examples, the light source system 404 may be configured to transmit light in infrared or near infrared (NIR) region of the electromagnetic spectrum (about 700 to 2500 nm). In view of factors such as skin reflectance, fluence, the absorption coefficients of blood and various tissues, and skin safety limits, one or both of these wavelength ranges may be suitable for various use cases.

In various configurations, the light source system 404 may incorporate anti-reflection (AR) coating, a mirror, a light-blocking layer, a shield to minimize crosstalk, etc.

The light source system 404 may include various types of drive circuitry, depending on the particular implementation. In some disclosed implementations, the light source system 404 may include at least one multi-junction laser diode, which may produce less noise than single-junction laser diodes. In some examples, the light source system 404 may include a drive circuit (also referred to herein as drive circuitry) configured to cause the light source system 404 to emit pulses of light at pulse widths in a range from 3 nanoseconds to 1000 nanoseconds. According to some examples, the light source system 404 may include a drive circuit configured to cause the light source system 404 to emit pulses of light at pulse repetition frequencies in a range from 1 kilohertz to 100 kilohertz.

In some implementations, the control system 406 may include one or more general purpose single- or multi-chip processors, digital signal processors (DSPs), application specific integrated circuits (ASICs), field programmable gate arrays (FPGAs) or other programmable logic devices, discrete gates or transistor logic, discrete hardware components, or combinations thereof. The control system 406 also may include (and/or be configured for communication with) one or more memory devices, such as one or more random access memory (RAM) devices, read-only memory (ROM) devices, etc. Accordingly, the display apparatus 400 may have a memory system that includes one or more memory devices, though the memory system is not shown in FIG. 4. The control system 406 may be configured for receiving and processing data from the sensing system 404, as described below. If the display apparatus 400 includes an ultrasonic transmitter, such as in the sensing system 404, the control system 406 may be configured for controlling the ultrasonic transmitter. In some implementations, functionality of the control system 406 may be partitioned between one or more controllers or processors, such as a dedicated sensor controller and an applications processor of a mobile device.

In some examples, the control system 406 may be communicatively coupled to the light source system 404 and configured to control the light source system 404 to emit light towards a target object (such as a finger) on an outer surface of the interface 401. In some such examples, the control system 406 may be communicatively coupled to and configured to receive signals from the sensing system 404 (including one or more receiver elements, such as sensor elements 262) corresponding to the ultrasonic waves generated by the target object responsive to the light from the light source system.

Some implementations of the display apparatus 400 may include an interface system 408. In some examples, the interface system 408 may include a wireless interface system. In some implementations, the interface system 408 may include a user interface system, one or more network interfaces, one or more communication interfaces between the control system 406 and a memory system and/or one or more interfaces between the control system 406 and one or more external device interfaces (such as ports or applications processors), or combinations thereof. According to some examples in which the interface system 408 is present and includes a user interface system, the user interface system may include a microphone system, a loudspeaker system, a haptic feedback system, a voice command system, one or more displays, or combinations thereof. According to some examples, the interface system 408 may include a touch sensor system, a gesture sensor system, or a combination thereof. The touch sensor system (if present) may be, or may include, a resistive touch sensor system, a surface capacitive touch sensor system, a projected capacitive touch sensor system, a surface acoustic wave touch sensor system, an infrared touch sensor system, any other suitable type of touch sensor system, or combinations thereof.

In some examples, the interface system 408 may include a force sensor system. The force sensor system (if present) may be, or may include, a piezo-resistive sensor, a capacitive sensor, a thin film sensor (for example, a polymer-based thin film sensor), another type of suitable force sensor, or combinations thereof. If the force sensor system includes a piezo-resistive sensor, the piezo-resistive sensor may include silicon, metal, polysilicon, glass, or combinations thereof. An ultrasonic fingerprint sensor and a force sensor system may, in some implementations, be mechanically coupled. In some implementations, the force sensor system may be mechanically coupled to a platen. In some such examples, the force sensor system may be integrated into circuitry of the ultrasonic fingerprint sensor. In some examples, the interface system 408 may include an optical sensor system, one or more cameras, or a combination thereof.

According to some examples, the display apparatus 400 may include a noise reduction system 410. For example, the noise reduction system 410 may include one or more mirrors that are configured to reflect light from the light source system 404 away from receiver elements. In some implementations, the noise reduction system 410 may include one or more sound-absorbing layers, acoustic isolation material, light-absorbing material, light-reflecting material, or combinations thereof. In some examples, the noise reduction system 410 may include acoustic isolation material, which may reside between the light source system 404 and at least a portion of the receiver elements. In some examples, the noise reduction system 410 may include one or more electromagnetically shielded transmission wires. In some such examples, the one or more electromagnetically shielded transmission wires may be configured to reduce electromagnetic interference from circuitry of the light source system, receiver system circuitry, or combinations thereof, that is received by the receiver system.

In some implementations, the display apparatus 400 may be part of a mobile device or a wearable device configured to be worn by a user, such as around the wrist, finger, arm, leg, ankle, or another appendage, or another portion of the body. In an example implementation, the wearable device may have the form of a wristwatch and can be worn around the wrist.

Figure 5A:
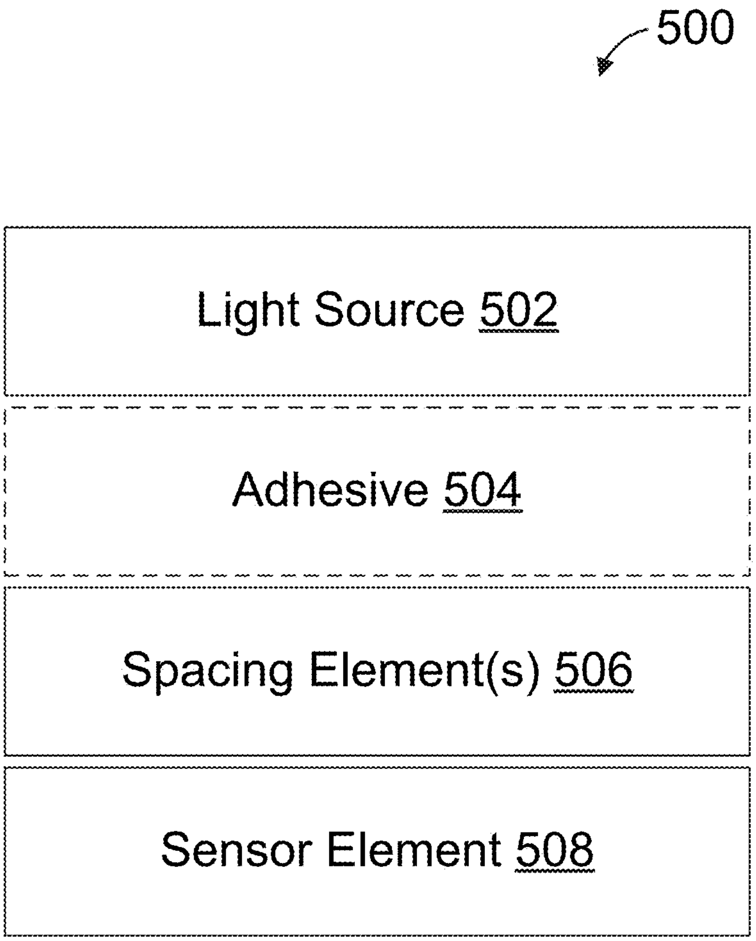
FIG. 5A shows a block diagram of an example material stack that can be implemented in a display apparatus.

FIG. 5A shows a block diagram of an example material stack 500 that can be implemented in a display apparatus. The example material stack 500 may be a basic representation of other implementations of material stacks that will be described below. Example material stack 500 may include a light source 502, one or more spacing elements 506, and a sensor element 508. OLEDs or COE OLEDs may be examples of the light source 502. A fingerprint sensor may be an example of the sensor element 508. In some implementations, a coupling material such as an adhesive 504 may optionally be included in the example material stack 500, which in the illustrated example may be disposed between the light source 502 and a spacing element 506 to fix them relative to each other. However, coupling material may be present elsewhere in the example material stack 500 in more than one place.

In various implementations, the one or more spacing elements 506 may include one or more different layers of materials of varying properties. Such properties may include, for example, modulus or elastic modulus, thickness, size, dimensions, light reflectance, color or resulting color, type of material (for example, polymer, metal, adhesive). Other properties also may be varied. Specific combinations of the one or more spacing elements 506 and their properties may result in advantageous mitigation of visual defects relating to the sensor element 508 (such as a sensor mark as described with respect to FIG. 1) while maintaining performance of the sensor element 508 at an acceptable level. Example implementations will now be illustrated and described.

Figure 5B:
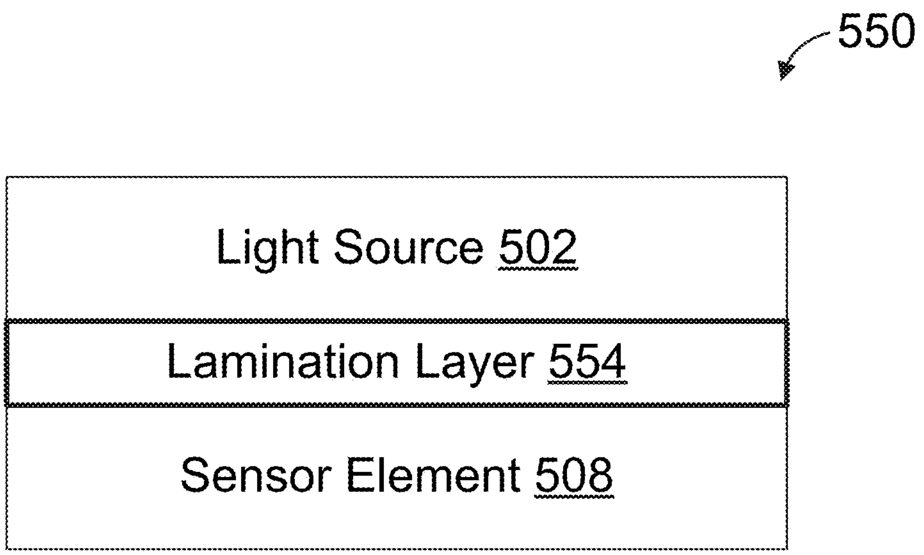
FIG. 5B shows a block diagram of another example material stack.

FIG. 5B shows a block diagram of an example material stack 550. In this example, a lamination layer 554 may be included. A lamination layer may generally refer to an adhesive portion between other layers. in the example material stack 550, a lamination layer 554 may exist between the sensor element 508 and other layers such as the light source 502 or other key components such as a cover glass, screen, etc. (not shown) while enabling the usage of the sensor element 508 (such as ultrasonic or optical signals can pass through to the sensor element 508). The organization of materials in layers can result in a stack of layers of varying materials and other properties to be adhered or held together, which allows the sensor element 508 to be positioned as intended, functional, and/or shielded from outside elements.

Improvements upon the foregoing can be made using variations or combinations of variations in material, mechanical, and visual properties of layers used in a material stack to mitigate visual defects such as a sensor mark, which are described in the example implementations below.

Figure 6:
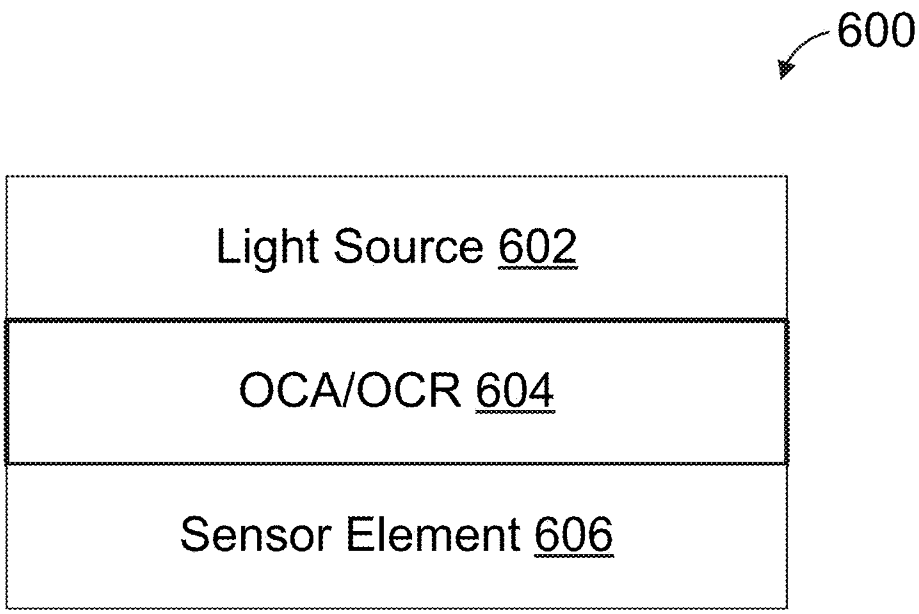
FIG. 6 shows a block diagram of an example material stack implementing an optical clear adhesive (OCA) layer or an optical clear resin (OCR) layer.

FIG. 6 shows a block diagram of an example material stack 600 implementing an optical clear adhesive (OCA) layer or an optical clear resin (OCR) layer. Example material stack 600 may include a light source 602, an OCA or OCR layer 604, and a sensor element 606. In the example material stack 600, the OCA or OCR layer 604 may be disposed between and/or adhered to the light source 602 and the sensor element 606. Examples of the light source 602 may include an OLED layer or a COE OLED layer. Examples of the sensor element 606 may include ultrasonic sensor array 200, sensor system 302, or ultrasonic sensor array 312.

OCA may refer to an optically clear bonding film material similar to a double-sided adhesive tape, with a bonding capability that is suited for applications where low thickness and high adhesion is critical, including in applications such as display screens, touchscreens, or other user interfaces or components. OCA bonding hence results in thin bond lines. OLED displays and LCDs are possible applications. Bonding between rigid materials and bonding between rigid and flexible materials are both possible. OCA bonding is resistant to formation of bubbles and air gaps, maximizing optical clarity and transparency and minimizing light reflections. A refractive index close to that of the material to be bonded may be selected to reduce reflection from an adjacent layer (OLED display, cover glass, touchscreen, etc.). Light transmission through OCA layers can exceed 99%. Example materials for OCA include acrylic, silicone, or urethane. However, a wide range of materials may be used for OCA bonding. OCR is similar to OCA; however, OCR is in a liquid (resin) form. OCR is effective in eliminating air gap in its liquid form.

Advantageously, OCA and OCR possess softness and elasticity that can minimize the internal stress of lamination forces, thereby mitigating the formation of, for example, sensor marks over time. An OCA or OCR layer 604 may be characterized by properties selected to minimize the internal stress and formation of sensor marks.

In some implementations, the modulus of elasticity (also referred to herein as the clastic modulus) of the OCA or OCR layer 604 may be between about 0.1 to 0.5 megapascals (MPa), for example, about 0.2 MPa or up to about 0.2 MPa. The OCR (resin) may possess such an clastic modulus after a curing process (such as via thermal curing or ultraviolet-based curing). In some implementations, the elastic modulus of the OCA or OCR layer 604 may be up to about 1 MPa (or more).

In some implementations, the thickness of the OCA or OCR layer 604 may be between about 25 and 100 microns (μm), for example 75 μm. In some implementations, the thickness of the OCA or OCR layer 604 may be up to about 200 μm. In some implementations, the thickness of the OCA or OCR layer 604 may be up to about 300 μm. One example range that the thickness of the OCA or OCR layer 604 may be selected from is between about 25 to 300 μm.

A relatively low elastic modulus and thickness would enable the softness and lower internal stress while retaining the sensitivity to the sensor element 606. One specific implementation of the OCA or OCR layer 604 may have an elastic modulus of 0.2 MPa and a thickness of 75 μm.

Thus, formation of visual defects may be mitigated in these implementations via mechanical (such as modulus, thickness) and materials (such as OCA) approaches.

Figure 7A:
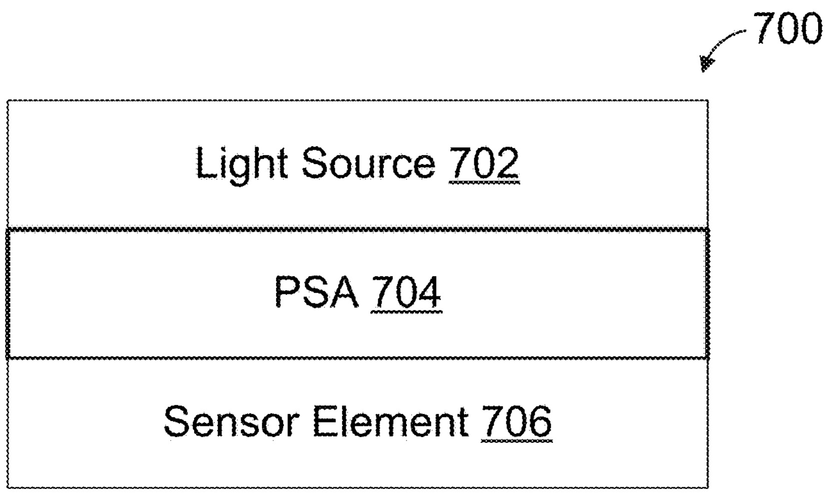
FIGS. 7A-7C show block diagrams of example material stacks each implementing at least a pressure sensitive adhesive (PSA) layer.

FIG. 7A shows a block diagram of an example material stack 700 implementing a pressure sensitive adhesive (PSA) layer. Example material stack 700 may include a light source 702, a PSA layer 704, and a sensor element 706. In the example material stack 700, the PSA layer 704 may be disposed between and/or adhered to the light source 702 and the sensor element 706. Examples of the light source 702 may include an OLED layer or a COE OLED layer. Examples of the sensor element 706 may include ultrasonic sensor array 200, sensor system 302, or ultrasonic sensor array 312.

PSA may refer to a nonreactive adhesive that forms a bond with another surface when pressure is applied. In some cases, a PSA may be in the form of a tape or film, which may be a thin and flexible material capable of single- or double-sided adhesion (single- or double-sided coating). Example type of materials of PSA adhesives may include rubber, acrylic, and silicone. A PSA layer and may thus be clear and transparent, or have a low reflectance value so as to be darker. Upon application of pressure, a PSA layer may be sticky or tacky on at least one side so as to resist lamination or shear (parallel) forces and thereby secure layer(s) and/or component(s).

Figure 7B:
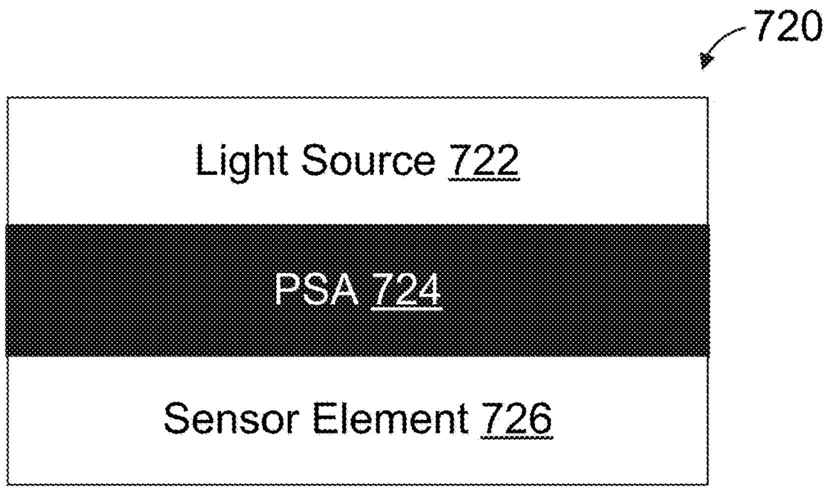

In some configurations, such as the example material stack 720 shown in FIG. 7B, a PSA layer 724 having a low light reflectance may be disposed between and/or adhered to a light source 722 and a sensor element 726.

In some implementations, the light reflectance of the PSA layer 724 may be about 10% or under, about 5% or under, about 2% or under, or about 1% or under. Such a PSA layer having low light reflectance may appear to have a shade of black and/or be dark, gray, or black in color. Such a color may be achieved by dying the PSA, for example, using a corresponding amount of black dye. In other examples, the shade of black of the PSA may be achieved using a chemical such as dye or paint, a powder, or other liquid or solid material(s) used when curing the PSA. Advantageously, the lower reflectance visually masks any sensor mark that may be visible to a user otherwise. In some implementations, the light reflectance may be higher, such as between 10-50% or between 50-75%.

In some implementations, the thickness of the PSA layer 704 or 724 may be between about 25 to 150 μm, for example 75 μm. As alluded to, it is a concurrent goal to maintain an acceptable level of sensor performance, which may be measured by, such as signal intensity and/or signal quality (for example, a signal-to-noise ratio). A thinner lamination layer or adhesive may be beneficial to sensor performance. Hence, the thickness of the PSA layer 704 or 724 may be selected based on sensor performance. Moreover, in some cases, the temperature of the device implementing the example material stack 700 may affect sensor performance, and certain thicknesses (as examples, about 75 μm, or between about 50 to 100 μm) may have the best overall (such as based on an average or a maximum) performance across a temperature range (such as between −15 C and 55 C). Nonetheless, in some implementations, the thickness of the PSA layer 704 or 724 may be up to about 300 μm.

In some implementations, the elastic modulus of the PSA layer 704 or 724 may be between about 0.1 to 0.5 MPa, for example, about 0.2 MPa or up to about 0.2 MPa. In some implementations, the elastic modulus of the PSA layer 704 or 724 may be up to about 1 MPa (or more).

Generally, a balance of sensor performance or sensing resolution and mitigation of sensor mark can be considered when selecting the level of light reflectance, especially if visual acuity, resolution, or other confirmation of an object or proximity of object to be detected is needed, or if greater sensor capabilities are needed. Ultrasonic sensor systems that emit and receive ultrasonic waves may not require strong consideration of how much visual masking there is based on light reflectance.

Figure 7C:
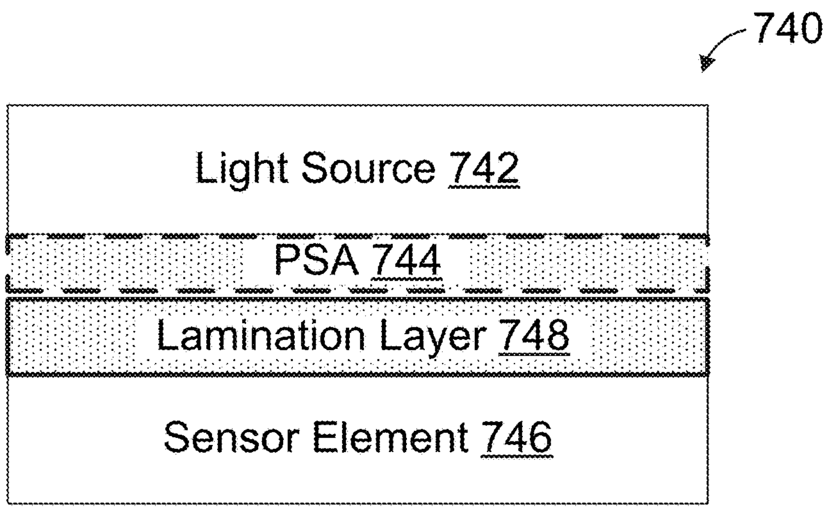

In some configurations, such as the example material stack 740 shown in FIG. 7C, a PSA layer 744 may be disposed between and/or adhered to a light source 742 and a sensor element 746. In some configurations, the PSA layer 744 may be optional, and only a lamination layer 748 (holding together the light source 742 and the sensor element 746) may be present. The PSA layer 744 may have low light reflectance (giving it a dark, gray, or black color similar to the PSA layer 724 of FIG. 7B), or it may be clear and transparent (similar to the PSA layer 704 of FIG. 7A). In the example material stack 740, the PSA layer 744 may be adjacent and/or adhered to an additional material layer, such as lamination layer 748. The lamination layer 748 may provide additional spacing, cushioning, visual occlusion, or stability among the layers of the example material stack 740.

In some variants not illustrated, the example material stack 740 may further include a double-sided tape (DST), such as a copper-based DST, which may have low visual transparency similar to the PSA layer 724 of FIG. 7B. In some configurations, the DST may be based other types of metals, such as aluminum or stainless steel. In some configurations, the DST may be based on non-metals, such as polymers of the type described herein. In some variants not illustrated, the example material stack 740 may further include any plastic material such as but not limited to, polyimide (PI), polycarbonate (PC), polystyrene (PS), polyethylene (PE), polyethylene terephthalate (PET), and/or carbon fiber-reinforced plastic (CFRP). In some variants, the lamination layer 748 may include any inorganic material, such as glass (such as inorganic silica-based glass) or ceramic. In other cases, the lamination layer 748 may include a suitable organic material such as allyl diglycol carbonate (ADC) may be used, a plastic transparent material. In some implementations, the lamination layer 748 may possess a low light reflectance (as a result of using a dye, paint, or powder, for example).

Thus, visual defects and/or formation thereof may be mitigated in these implementations via mechanical (such as modulus, thickness), materials (such as PSA), and visual (such as light reflectance, color) approaches.

Figure 8A:
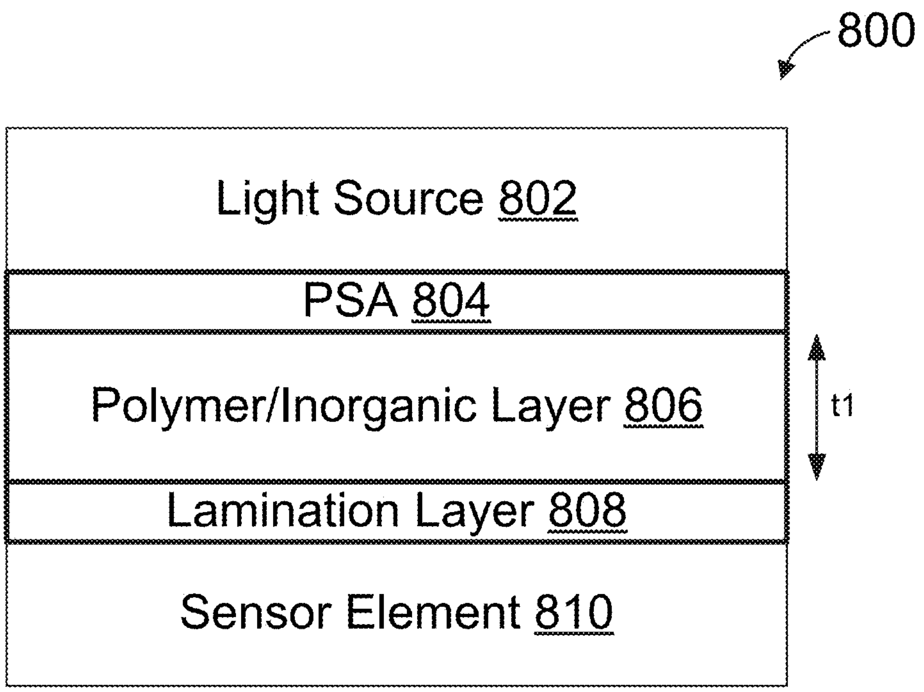
FIGS. 8A-8C show block diagrams of example material stacks each implementing a PSA layer, a polymer/inorganic layer, and a lamination layer.

FIG. 8A shows a block diagram of an example material stack 800 implementing a PSA layer, a polymer/inorganic layer, and a lamination layer. Example material stack 800 may include a light source 802, a PSA layer 804, a polymer/inorganic layer 806, a lamination layer 808, and a sensor element 810. The PSA layer 804, polymer/inorganic layer 806, and lamination layer 808 may be disposed adjacent to one another as shown in FIG. 8A. more specifically, the polymer/inorganic layer 806 may be disposed between the PSA layer 804 and the lamination layer 808. Given the adhesive nature of PSA as discussed above, these layers may be secured relative to one another and other layers (for example, light source 802, sensor element 810).

In various implementations, the PSA layer 804 may be similar to the PSA layer 704, 724, or 744 as discussed above. In some implementations, the lamination layer 808 may be similar to the lamination layer 748 as discussed above, and may be a copper-based DST, for example. Examples of the light source 802 may include an OLED layer or a COE OLED layer. Examples of the sensor element 810 may include ultrasonic sensor array 200, sensor system 302, or ultrasonic sensor array 312.

In some variants, the polymer/inorganic layer 806 may be constructed of or based on a polymer, such as but not limited to, polyimide (PI), polycarbonate (PC), polystyrene (PS), polyethylene (PE), polyethylene terephthalate (PET), and/or carbon fiber-reinforced plastic (CFRP). In some variants, the polymer/inorganic layer 806 may be constructed of or based on an inorganic material, such as glass (such as inorganic silica-based glass) or ceramic. In other cases, the polymer/inorganic layer 806 may include a suitable organic material such as allyl diglycol carbonate (ADC) may be used.

Properties of the polymer/inorganic layer 806 may vary. In some implementations, the thickness t1 of the polymer/inorganic layer 806 may be between about 25 and 300 μm. In some implementations, the thickness t1 of the polymer/inorganic layer 806 may be between about 25 and 200 μm. In some implementations, the thickness t1 of the polymer/inorganic layer 806 may be between about 25 and 150 μm. In some implementations, the thickness t1 of the polymer/inorganic layer 806 may be between about 150 and 200 μm. The polymer/inorganic layer 806 may be relatively thicker than other layers, such as the PSA layer 804 and the lamination layer 808. As an illustrative example, the PSA layer 804 and the lamination layer 808 may each be about 75 μm thick, while the polymer/inorganic layer 806 may be about 150 μm thick (t1=150 μm).

Advantageously, the presence of the polymer/inorganic layer 806 may minimize deformation of layers that lead to sensor marks or other visual defects. While a thicker polymer/inorganic layer is more effective at mitigating sensor marks, signal strength and quality may be affected by layer(s) that are too thick. To balance the reduction of visual defects and/or their formation (where formation may be prevented by using the polymer/inorganic layer 806) with sensor performance, the thickness of the polymer/inorganic layer may be adjusted according to the desired balance.

Figure 8B:
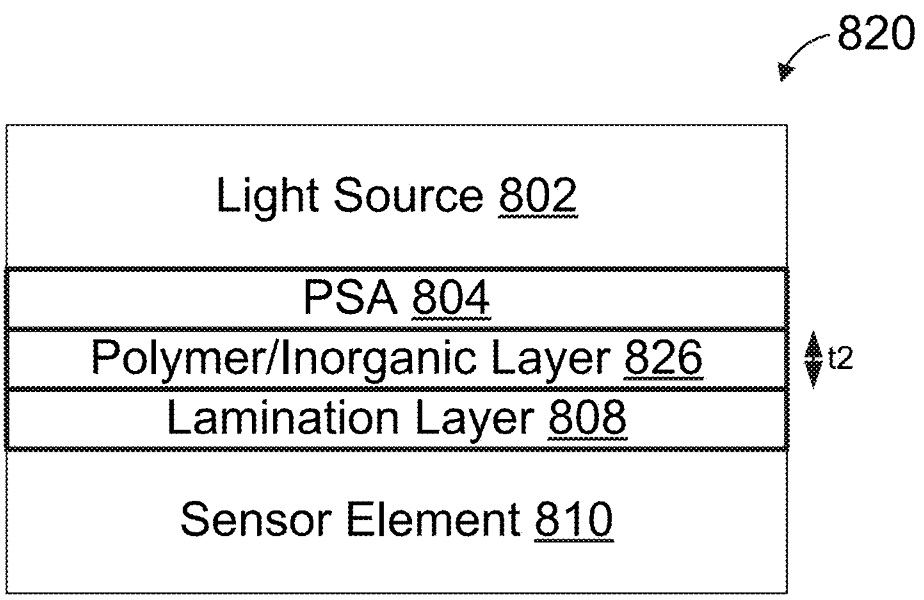

To this end, in some configurations such as the example material stack 820 shown in FIG. 8B, the thickness t2 of the polymer/inorganic layer 826 may be lower than the thickness t1 of the polymer/inorganic layer 806 of the example material stack 800. In some implementations, the thickness t2 of the polymer/inorganic layer 826 may be between about 25 and 75 μm.

Figure 8C:
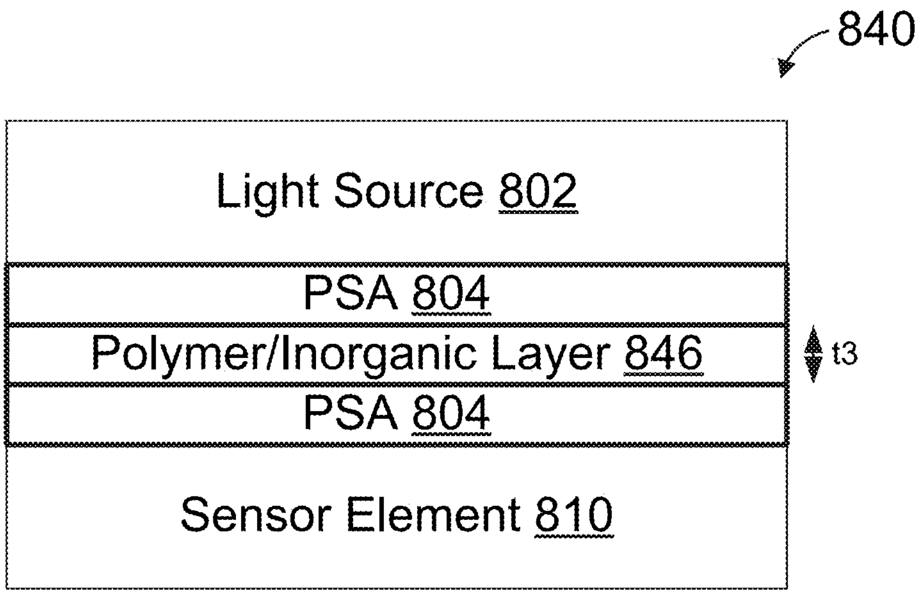

In another variation shown in FIG. 8C, an example material stack 840 may include a polymer/inorganic layer 846 disposed between two PSA layers 804. That is, the lamination layer may be at least part of another PSA layer. The polymer/inorganic layer 846 may have a thickness t3 that may be similar to the values associated with thickness t1 or t2 of polymer/inorganic layer 806 or 826, respectively.

Thus, formation of visual defects may be mitigated in these implementations via mechanical (such as thickness, prevention of deformation) and materials (such as PSA, polymer, inorganic material) approaches.

Figure 9A:
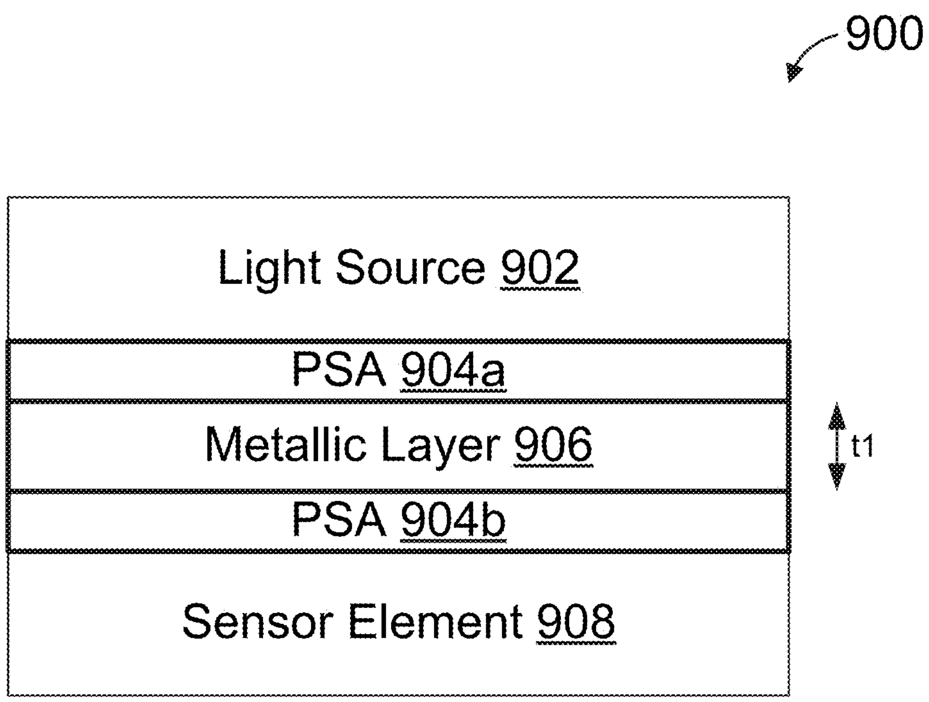
FIGS. 9A and 9B show block diagrams of example material stacks each implementing PSA layers and a metallic layer.

FIG. 9A shows a block diagram of an example material stack 900 implementing PSA layers and a metallic layer. Example material stack 900 may include a light source 902, a first PSA layer 904*a*, a metallic layer 906, a second PSA layer 904*b*, and a sensor element 908, where the metallic layer 906 may be disposed between the first and second PSA layers 904*a* and 904*b*. Given the adhesive nature of PSA, the metallic layer and the PSA layers may be secured relative to one another and other layers (for example, light source 902, sensor element 908).

In various implementations, the PSA layers 904*a* and 904*b* may be similar to the PSA layer 704, 724 or 744 as discussed above. Examples of the light source 902 may include an OLED layer or a COE OLED layer. Examples of the sensor element 910 may include ultrasonic sensor array 200, sensor system 302, or ultrasonic sensor array 312.

In some implementations, the metallic layer 906 may be composed of a metal, such as copper or aluminum. Myriad other types of metallic materials such as stainless steel or titanium may be used in other implementations. The material used is not limited to the examples given here. In some implementations, the thickness t1 of the metallic layer 906 may be between about 6 and 50 μm. In some cases, the thickness t1 of the metallic layer 906 may depend on the material. For instance, a metallic layer 906 that is copper-based may have a thickness t1 that is between about 6 and 50 μm, while an aluminum-based metallic layer may have a thickness t1 that is between about 25 and 50 μm.

Advantageously, the presence of the metallic layer 906 may minimize deformation of layers that lead to sensor marks or other visual defects, similar to presence of the polymer/inorganic layer 806. A thinner metallic layer may be beneficial to sensor performance when balancing mitigation of sensor marks and performance.

Figure 9B:
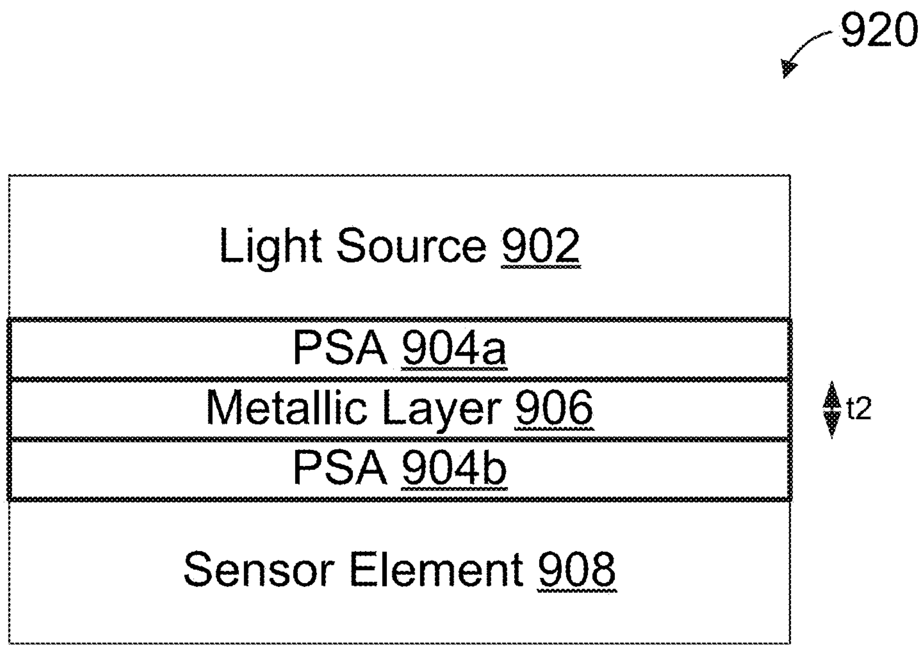

Hence, in alternative implementations such as the example material stack 920 shown in FIG. 9B, the thickness t2 of the metallic layer 926 may be lower than lower than the thickness t1 of the metallic layer 906 of the example material stack 800. In some implementations, the thickness t2 of the metallic layer 926 may be between about 6 and 15 μm. In some implementations, the thickness t2 of the metallic layer 926 may be between about 15 and 25 μm.

Thus, formation of visual defects may be mitigated in these implementations via mechanical (such as thickness, prevention of deformation) and materials (such as PSA, metallic material) approaches.

Figure 10A:
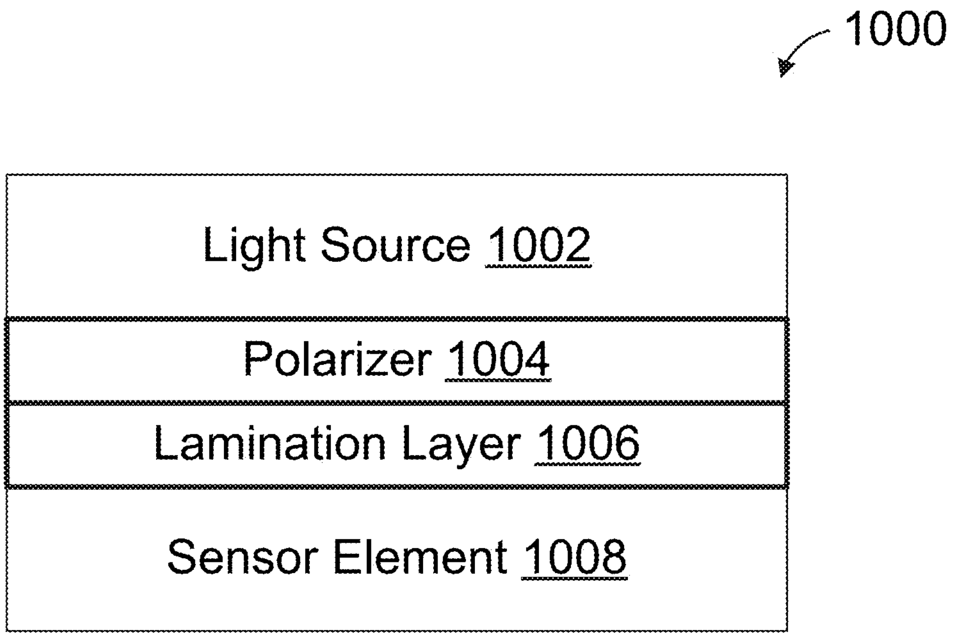
FIGS. 10A and 10B show block diagrams of example material stacks each implementing a polarizer and a lamination layer.

FIG. 10A shows a block diagram of an example material stack 1000 implementing a polarizer and a lamination layer. Example material stack 1000 may include a light source 1002, a polarizer layer 1004, a lamination layer 1006, and a sensor element 1008. In some cases, the example material stack 1000 may further include at least one PSA, OCA or OCR, for example between the polarizer layer 1004 and the sensor element 1008, the PSA, OCA or OCR being similar to those discussed in some of the aforementioned implementations (such as example material stack 600, 700, 720 or 740). In some cases, an additional layer such as at least one PSA, OCA or OCR may be disposed between the light source 1002 and the polarizer layer 1004.

Figure 10B:
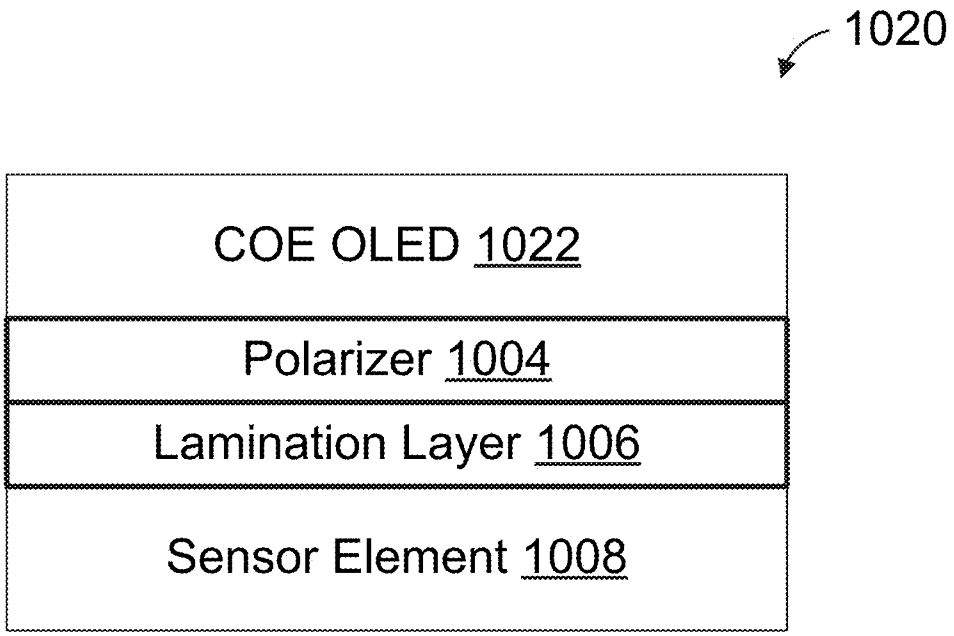

An example of the light source 1002 may be an OLED layer. In some implementations, the light source 1002 may be a COE OLED layer as shown in FIG. 10B. A backside polarizer is a typical component in OLEDs and omitted in COE OLEDs. Implementation of COE can have substantial power savings as compared to usage of polarizers. However, omission of the polarizer makes COE OLEDs more susceptible to sensor marks. It has been found that adding a polarizer layer 1004 back to typically polarizer-free COE OLEDs mitigates sensor marks, resulting in an unexpected benefit.

Figure 11A:
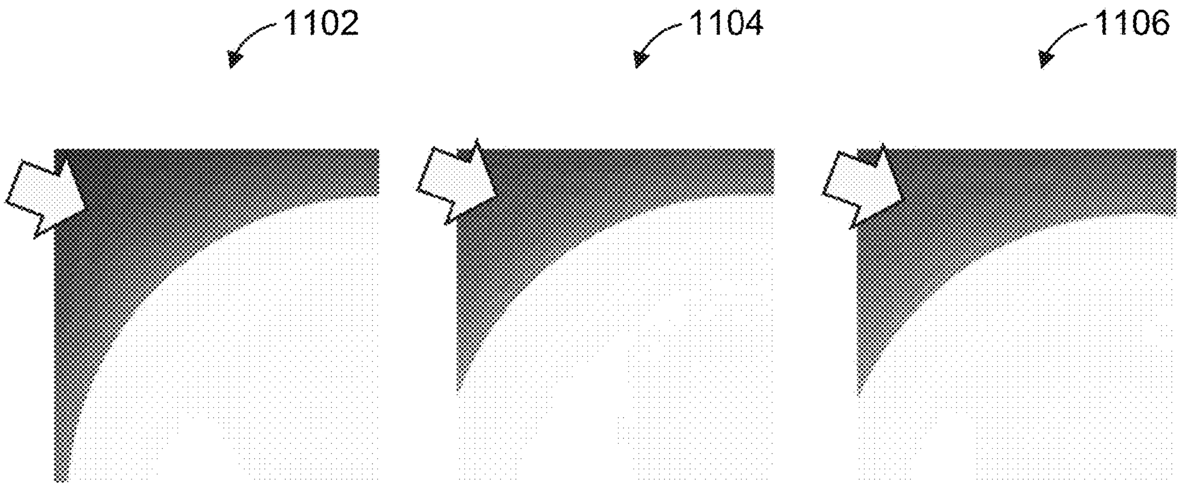
FIG. 11A shows examples of severe sensor marks that are visible or noticeable.
Figure 11B:
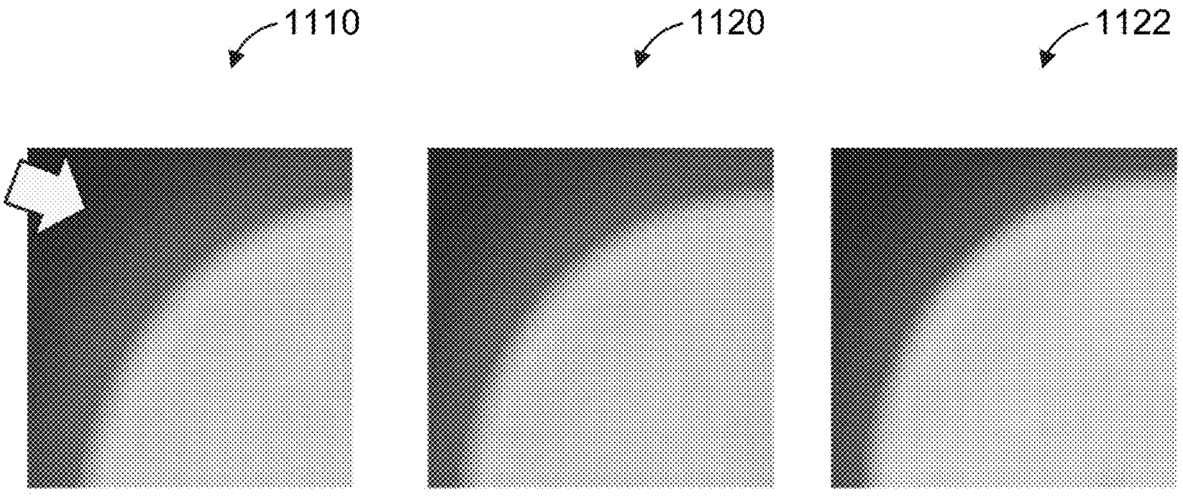
FIG. 11B shows examples of sensor marks that are acceptably present or unnoticeable.

As a result of the above-described implementations, sensor marks and their formation may be mitigated to an acceptable extent. A user may not be able to easily perceive a sensor mark through the screen, for instance, or may not be able to notice it at all even at an angle or under illumination. FIGS. 11A and 11B compare examples of sensor marks that are visible and those that are acceptably present.

FIG. 11A shows examples 1102, 1104 and 1106 of severe sensor marks that are visible or noticeable. Arrows indicate where sensor marks may be visible. FIG. 11B shows examples 1110, 1120 and 1122 of acceptably present or unnoticeable (or absent) sensor marks. An arrow in example 1110 indicates that a sensor mark may be noticeable under certain conditions (such as at an angle or under strong light). However, the severity of the sensor mark may be low. Examples 1120 and 1122 show that sensor marks that are of very low severity. Some or all of the above-described implementations, including the properties selected, may result in sensor marks that are of low severity or possibly absent entirely.

Figure 12:
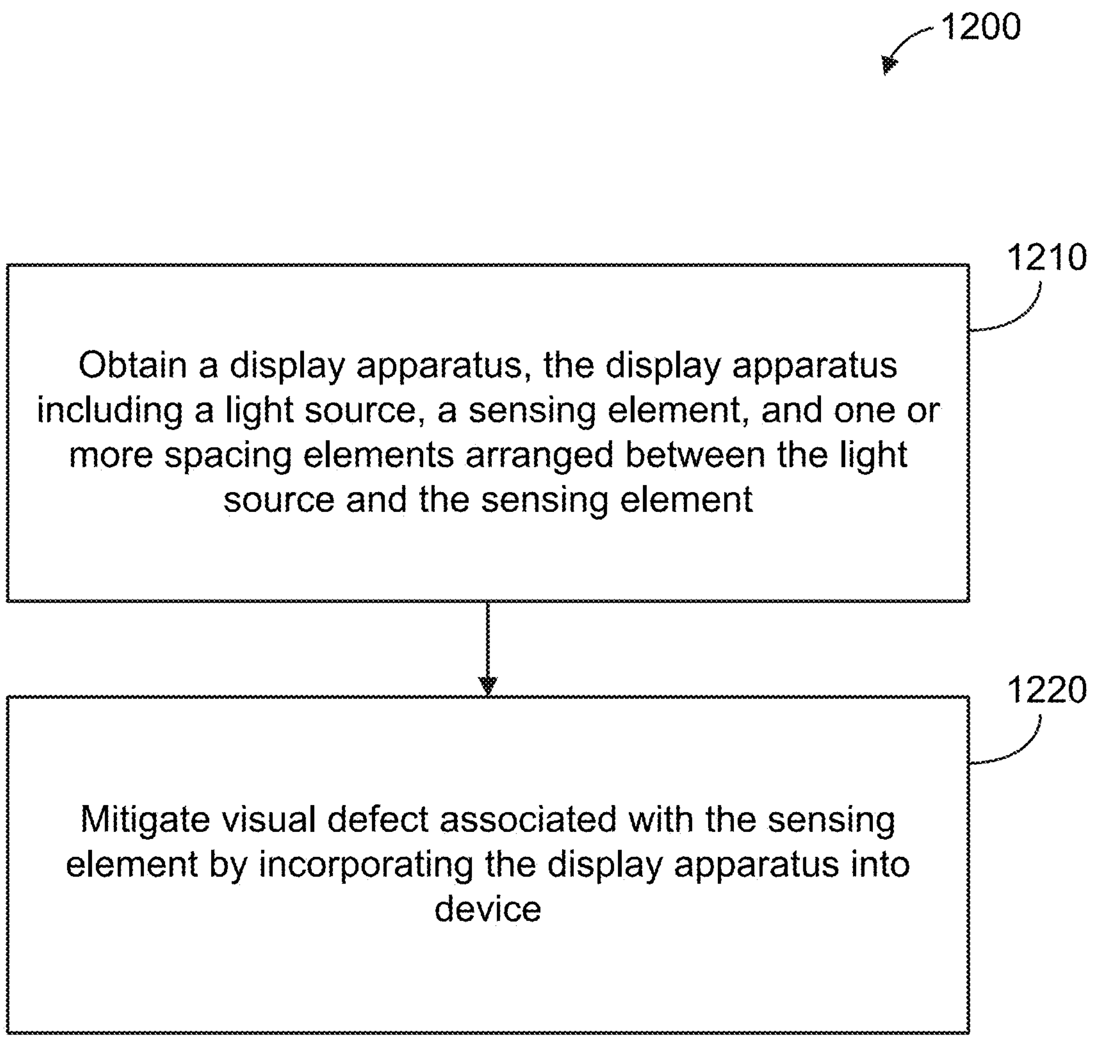
FIG. 12 shows a flow diagram of a method of mitigating a visual defect.

FIG. 12 is a flow diagram of a method 1200 of mitigating a visual defect. Structure for performing the functionality illustrated in one or more of the blocks shown in FIG. 12 may be performed by hardware and/or software components of a computerized apparatus or system.

The method outlined in FIG. 12 may include more or fewer blocks than indicated. Moreover, the blocks of methods disclosed herein are not necessarily performed in the order indicated. In some instances, one or more of the blocks shown in FIG. 12 may be performed concurrently.

At block 1210, the method 1200 may include obtaining a display apparatus. In some implementations, the obtaining a display apparatus may include a light source, a sensing element, and one or more spacing elements arranged between the light source and the sensing element. In different implementations, the one or more spacing elements may include at least one pressure sensitive adhesive (PSA) layer, optical clear adhesive (OCA) layer, optical clear resin (OCR) layer, polymer layer, inorganic layer, metallic layer, polarizer layer, and/or lamination layers as described herein.

At block 1220, the method 1200 may include mitigating the visual defect, the visual defect associated with the sensing element, by incorporating the display apparatus into the device. In some cases, the visual defect may include a sensor mark that is visually indicative of a boundary or a location of the sensing element through a transparent layer associated with the light source.

In some implementations, the visual defect may be mitigated visually using a low light reflectance material or a backside polarizer, mechanically using a low elastic modulus material, and/or materially using a polymer-based layer or a metallic layer. Various properties of the materials may be selected to achieve the desired mitigation while maintaining sensor resolution and performance at an acceptable level. Example ranges and values of these properties have been described herein.

Figure 13:
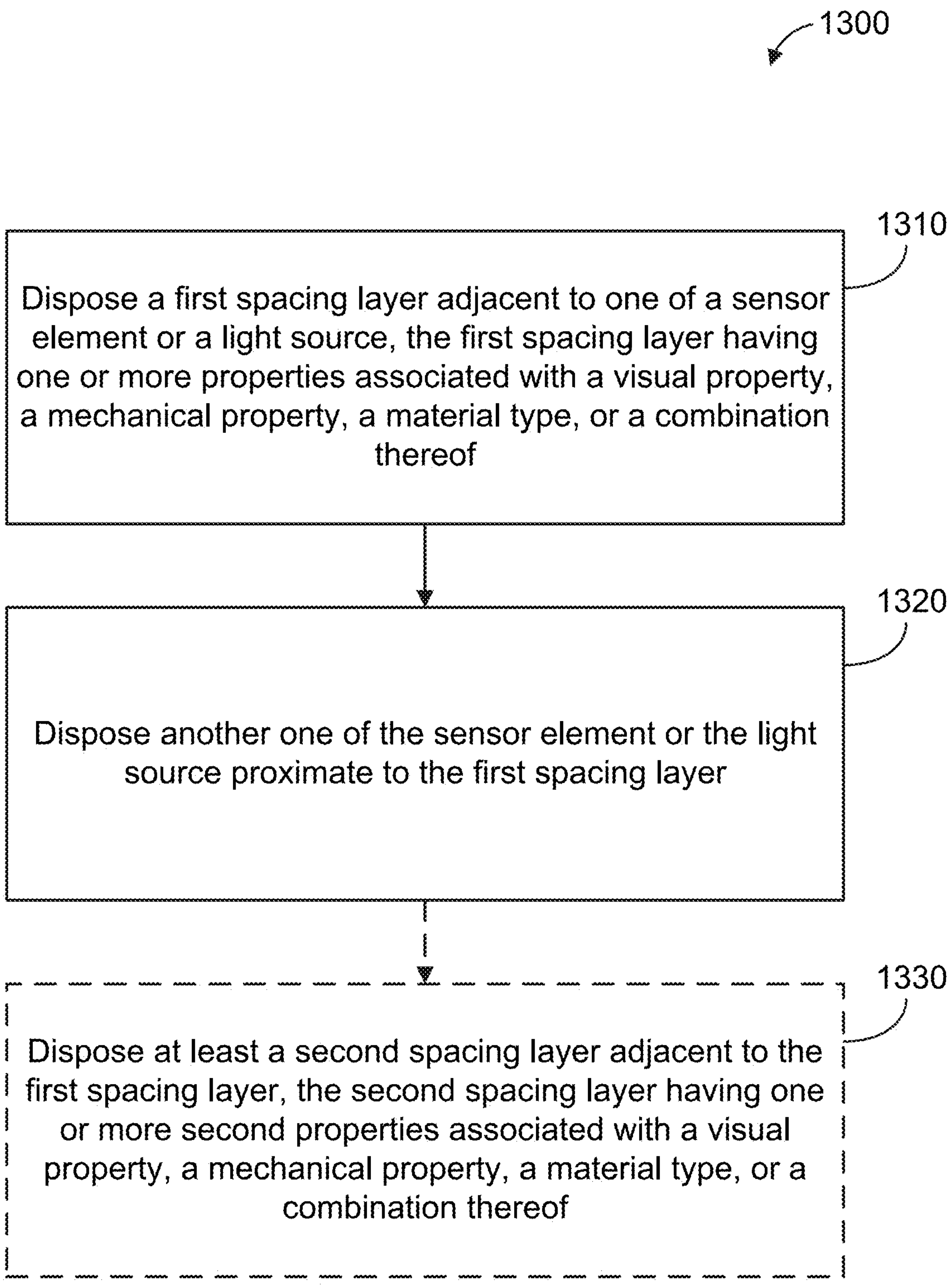
FIG. 13 shows a flow diagram of a method of obtaining a display apparatus configured to mitigate a visual defect.

FIG. 13 is a flow diagram of a method 1300 of obtaining a display apparatus configured to mitigate a visual defect. Structure for performing the functionality illustrated in one or more of the blocks shown in FIG. 13 may be performed by hardware and/or software components of a computerized apparatus or system.

The method outlined in FIG. 13 may include more or fewer blocks than indicated. Moreover, the blocks of methods disclosed herein are not necessarily performed in the order indicated. In some instances, one or more of the blocks shown in FIG. 13 may be performed concurrently.

At block 1310, the method 1300 may include disposing a first spacing layer adjacent to one of a sensor element or a light source, the first spacing layer having one or more properties associated with a visual property, a mechanical property, a material type, or a combination thereof. In some implementations, the light source may include an OLED layer, or in some cases, a COE OLED layer. In some implementations, the first spacing layer may include a PSA, OCA, OCR, polymer, inorganic substance, or a metallic substance. In some implementations, the first spacing layer may include a polarizer, including implementations in which the light source includes a COE OLED layer. In some implementations, the sensor element may be a fingerprint sensor of the type described with respect to FIGS. 2A-3B.

In some implementations, the visual property may include a light reflectance value. For example, a light reflectance value of 10% or under may reduce the visibility of the sensor element and any marks associated with the sensor element. In some cases, a black dye may be used to obtain a black or nearly black PSA layer, as described with respect to FIG. 7B, for example.

In such cases, disposing the PSA layer may involve adhering the PSA layer to the sensor element or the light source. In other cases, an OCA layer or an OCR may also be adhered to the sensor element or the light source; or a polymer, inorganic, or metallic layer, or a polarizer layer may be aligned and placed with respect to the sensor element or the light source (flushed against one or more edges of the sensor element or the light source, for instance).

In some implementations, the mechanical property may include an elastic modulus. For example, an OCA layer or OCR layer may have an elastic modulus value selected from 0.1 to 0.5 MPa, such as 0.2 MPa.

In some implementations, the material type may include a polymer, an inorganic substance, or a metallic substance (such as copper or aluminum). These material types may have thicknesses that mitigate formation of sensor marks.

At block 1320, the method 1300 may include disposing another one of the sensor element or the light source proximate to the first spacing layer. A display apparatus may be obtained.

In some implementations, the method 1300 may optionally include block 1330, which may include disposing at least a second spacing layer adjacent to the first spacing layer, the second spacing layer having one or more second properties. The one or more second properties may be associated with a visual property, a mechanical property, a material type, or a combination thereof. In some cases, the one or more second properties may be different from the one or more properties of block 1310. As an example of the first layer and at least the second layer, a metallic layer may be placed adjacent to a PSA layer or between two PSA layers. The metallic layer and the PSA layer(s) may possess different properties. A PSA layer may be adhered to the light source or the sensor element, such as the implementations described with respect to FIGS. 9A and 9B.

Implementation examples are described in the following numbered clauses:

Clause 1. A display apparatus including: a light source; a sensing element; and one or more spacing elements arranged between the light source and the sensing element, at least one of the one or more spacing elements including a first pressure sensitive adhesive (PSA) layer having a thickness between 25 and 150 μm and a light reflectance below 10%.

Clause 2. The display apparatus of clause 1, where the sensing element includes a fingerprint sensor configured to obtain fingerprint data through a transparent layer associated with the light source, and an operation by a device implementing the display apparatus is associated with the fingerprint data.

Clause 3. The display apparatus of clause 1, where the first PSA layer includes a black PSA layer having a shade of black.

Clause 4. The display apparatus of clause 3, where the black PSA layer is colored via use of a black dye, a black powder, or a black paint to produce the shade of black.

Clause 5. The display apparatus of clause 1, where the one or more spacing elements further include: a polymer-based spacing element or an inorganic spacing element adjacent to the PSA layer, where the thickness of the polymer-based spacing element is between 25 and 300 μm; and a copper-based double-sided tape (DST) layer adjacent to the polymer-based spacing element.

Clause 6. The display apparatus of clause 5, where the thickness of the polymer-based spacing element is between 150 and 200 μm.

Clause 7. The display apparatus of clause 1, where the one or more spacing elements further include: a second PSA layer; and a polymer-based spacing element disposed between the first PSA layer and the second PSA layer, where the thickness of the polymer-based spacing element is between 25 and 75 μm.

Clause 8. The display apparatus of clause 1, where the one or more spacing elements further include: a second PSA layer; and a metallic layer disposed between the first PSA layer and the second PSA layer, where a material of the metallic layer includes copper; where each of the first PSA layer and the second PSA layer includes a thickness between 3 and 15 μm, and the metallic layer includes a thickness between 6 to 50 μm.

Clause 9. The display apparatus of clause 8, where the thickness of the metallic layer includes a thickness between 6 and 15 μm.

Clause 10. The display apparatus of clause 1, where at least another one of the one or more spacing elements includes a metallic layer, and a material of the metallic layer includes copper, aluminum, or a combination thereof.

Clause 11. The display apparatus of clause 1, where the one or more spacing elements further include polyimide (PI), polycarbonate (PC), polystyrene (PS), polyethylene (PE), polyethylene terephthalate (PET), carbon fiber-reinforced plastic (CFRP), glass, ceramic, a metal, or a combination thereof.

Clause 12. The display apparatus of clause 1, where the light source includes an organic light-emitting diode (OLED).

Clause 13. The display apparatus of clause 12, where the OLED includes a Color Filter on Encapsulation OLED (COE OLED), and the one or more spacing elements include a polarizer layer configured to be used with the COE OLED.

Clause 14. The display apparatus of clause 1, where the one or more spacing elements are configured to mitigate a visual defect associated with the sensing element, the visual defect including a sensor mark that is visually indicative of a boundary or a location of the sensing element through a transparent layer associated with the light source.

Clause 15. A display apparatus including: a light source; a sensing element; and one or more spacing elements arranged between the light source and the sensing element, at least one of the one or more spacing elements including an optical clear adhesive (OCA) layer or an optical clear resin (OCR) layer, the OCA layer or the OCR layer having an elastic modulus of up to 0.2 megapascals (MPa) and a thickness between 25 and 300 μm.

Clause 16. The display apparatus of clause 15, where the thickness of the OCA layer or the OCR layer includes a thickness of up to 100 μm.

Clause 17. The display apparatus of clause 15, where the OCA layer or the OCR layer is configured to mitigate formation of a sensor mark associated with the sensing element/

Clause 18. A display apparatus including: a light source; a sensing element; and a plurality of spacing elements arranged between the light source and the sensing element, the plurality of spacing elements including: a pressure sensitive adhesive (PSA) layer; a polymer-based spacing element adjacent to the PSA layer, the polymer-based spacing element having a thickness between 25 and 300 μm; and a copper-based double-sided tape (DST) layer adjacent to the polymer-based spacing element.

Clause 19. The display apparatus of clause 18, where the polymer-based spacing element includes polyimide (PI), polycarbonate (PC), polystyrene (PS), polyethylene (PE), polyethylene terephthalate (PET), or carbon fiber-reinforced plastic (CFRP).

Clause 20. The display apparatus of clause 18, where the thickness of the polymer-based spacing element is between 150 and 200 μm.

Clause 21. A display apparatus including: a light source; a sensing element; and one or more spacing elements arranged between the light source and the sensing element, at least one of the one or more spacing elements including a first pressure sensitive adhesive (PSA) layer having a thickness between 25 and 150 μm.

Clause 22. The display apparatus of clause 21, where the one or more spacing elements further include: a second PSA layer; and a polymer-based spacing element disposed between the first PSA layer and the second PSA layer, where the thickness of the polymer-based spacing element is between 25 and 300 μm.

Clause 23. The display apparatus of clause 22, where a thickness of the polymer-based spacing element is between 150 and 200 μm.

Clause 24. The display apparatus of clause 21, where the one or more spacing elements further include: a second PSA layer; and a metallic layer disposed between the first PSA layer and the second PSA layer, where a material of the metallic layer includes copper; where each of the first PSA layer and the second PSA layer includes a thickness between 3 and 15 μm, and the metallic layer includes a thickness between 6 to 50 μm.

Clause 25. The display apparatus of clause 24, where the thickness of the metallic layer is between 6 and 15 μm.

Clause 26. The display apparatus of clause 21, where the first PSA layer includes a light reflectance below 10%.

Clause 27. The display apparatus of clause 26, where the light reflectance below 10% is effectuated by usage of a black dye, a black powder, or a black paint applied to the first PSA layer.

Clause 28. The display apparatus of clause 21, further including at least another one of the one or more spacing elements other than the first PSA layer, where a thickness of the at least another one of the one or more spacing elements other than the first PSA layer is up to 300 μm.

Clause 29. The display apparatus of clause 21, where the at least another one of the one or more spacing elements other than the first PSA layer includes polyimide (PI), polycarbonate (PC), polystyrene (PS), polyethylene (PE), polyethylene terephthalate (PET), carbon fiber-reinforced plastic (CFRP), glass, ceramic, a metal, or a combination thereof.

Clause 30. The display apparatus of clause 21, where: the light source includes a Color Filter on Encapsulation organic light-emitting diode (COE OLED); and the at least another one of the one or more spacing elements other than the first PSA layer includes a polarizer layer configured to be used with the COE OLED.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, multiple microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium, such as a non-transitory medium. The processes of a method or algorithm disclosed herein may be implemented in a processor-executable software module which may reside on a computer-readable medium. Computer-readable media include both computer storage media and communication media including any medium that may be enabled to transfer a computer program from one place to another. Storage media may be any available media that may be accessed by a computer. By way of example, and not limitation, non-transitory media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to a person having ordinary skill in the art, and the generic principles defined herein may be applied to other implementations without departing from the spirit or scope of this disclosure. Thus, the disclosure is not intended to be limited to the implementations shown herein, but is to be accorded the widest scope consistent with the claims, the principles and the novel features disclosed herein. The word “exemplary” is used exclusively herein, if at all, to mean “serving as an example, instance, or illustration.” Any implementation described herein as “exemplary” is not necessarily to be construed as preferred or advantageous over other implementations.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, other implementations are within the scope of the following claims. In some cases, the actions recited in the claims may be performed in a different order and still achieve desirable results.

It will be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations may be selectively combined to provide one or more comprehensive, but slightly different, technical solutions. It will therefore be further appreciated that the above description has been given by way of example only and that modifications in detail may be made within the scope of this disclosure.

Various modifications to the implementations described in this disclosure may be readily apparent to a person having ordinary skill in the art, and the generic principles defined herein may be applied to other implementations without departing from the spirit or scope of this disclosure. Thus, the following claims are not intended to be limited to the implementations shown herein, but are to be accorded the widest scope consistent with this disclosure, the principles and the novel features disclosed herein.

Additionally, certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. Moreover, various ones of the described and illustrated operations can itself include and collectively refer to a number of sub-operations. For example, each of the operations described above can itself involve the execution of a process or algorithm. Furthermore, various ones of the described and illustrated operations can be combined or performed in parallel in some implementations. Similarly, the separation of various system components in the implementations described above should not be understood as requiring such separation in all implementations. As such, other implementations are within the scope of the following claims. In some cases, the actions recited in the claims can be performed in a different order and still achieve desirable results.

What is claimed:

1. A display apparatus comprising:

a light source;

a sensing element; and one or more spacing elements arranged between the light source and the sensing element, at least one of the one or more spacing elements comprising a first pressure sensitive adhesive (PSA) layer having a thickness between 25 and 150 μm and a light reflectance below 10% %, the first PSA layer being grey or black in color.

2. The display apparatus of claim 1, wherein the sensing element comprises a fingerprint sensor configured to obtain fingerprint data through a transparent layer associated with the light source, and an operation by a device implementing the display apparatus is associated with the fingerprint data.

3. The display apparatus of claim 1, wherein the first PSA layer comprises a black PSA layer having a shade of black.

4. The display apparatus of claim 3, wherein the black PSA layer is colored via use of a black dye, a black powder, or a black paint to produce the shade of black.

5. The display apparatus of claim 1, wherein the one or more spacing elements further comprise:

a polymer-based spacing element or an inorganic spacing element adjacent to the PSA layer, wherein the thickness of the polymer-based spacing element is between 25 and 300 μm; and a copper-based double-sided tape (DST) layer adjacent to the polymer-based spacing element.

6. The display apparatus of claim 5, wherein the thickness of the polymer-based spacing element is between 150 and 200 μm.

7. The display apparatus of claim 1, wherein the one or more spacing elements further comprise:

a second PSA layer; and a polymer-based spacing element disposed between the first PSA layer and the second PSA layer, wherein the thickness of the polymer-based spacing element is between 25 and 75 μm.

8. The display apparatus of claim 1, wherein the one or more spacing elements further comprise:

a second PSA layer; and a metallic layer disposed between the first PSA layer and the second PSA layer, wherein a material of the metallic layer comprises copper;

wherein each of the first PSA layer and the second PSA layer comprises a thickness between 3 and 15 μm, and the metallic layer comprises a thickness between 6 to 50 μm.

9. The display apparatus of claim 8, wherein the thickness of the metallic layer comprises a thickness between 6 and 15 μm.

10. The display apparatus of claim 1, wherein at least another one of the one or more spacing elements comprises a metallic layer, and a material of the metallic layer comprises copper, aluminum, or a combination thereof.

11. The display apparatus of claim 1, wherein the one or more spacing elements further comprise polyimide (PI), polycarbonate (PC), polystyrene (PS), polyethylene (PE), polyethylene terephthalate (PET), carbon fiber-reinforced plastic (CFRP), glass, ceramic, a metal, or a combination thereof.

12. The display apparatus of claim 1, wherein the light source comprises an organic light-emitting diode (OLED).

13. The display apparatus of claim 12, wherein the OLED comprises a Color Filter on Encapsulation OLED (COE OLED), and the one or more spacing elements comprise a polarizer layer configured to be used with the COE OLED.

14. The display apparatus of claim 1, wherein the one or more spacing elements are configured to mitigate a visual defect associated with the sensing element, the visual defect comprising a sensor mark that is visually indicative of a boundary or a location of the sensing element through a transparent layer associated with the light source.

15. A display apparatus comprising:

a light source;

a sensing element; and one or more spacing elements arranged between the light source and the sensing element, at least one of the one or more spacing elements comprising an optical clear adhesive (OCA) layer or an optical clear resin (OCR) layer, the OCA layer or the OCR layer having an elastic modulus of up to 0.2 megapascals (MPa) and a thickness between 25 and 300 μm.

16. The display apparatus of claim 15, wherein the thickness of the OCA layer or the OCR layer comprises a thickness of up to 100 μm.

17. The display apparatus of claim 15, wherein the OCA layer or the OCR layer is configured to mitigate formation of a sensor mark associated with the sensing element.

18. A display apparatus comprising:

a light source;

a sensing element; and a plurality of spacing elements arranged between the light source and the sensing element, the plurality of spacing elements comprising:

a pressure sensitive adhesive (PSA) layer;

a polymer-based spacing element adjacent to the PSA layer, the polymer-based spacing element having a thickness between 25 and 300 μm; and a copper-based double-sided tape (DST) layer adjacent to the polymer-based spacing element.

19. The display apparatus of claim 18, wherein the polymer-based spacing element comprises polyimide (PI), polycarbonate (PC), polystyrene (PS), polyethylene (PE), polyethylene terephthalate (PET), or carbon fiber-reinforced plastic (CFRP).

20. The display apparatus of claim 18, wherein the thickness of the polymer-based spacing element is between 150 and 200 μm.

21. A display apparatus comprising:

a light source;

a sensing element; and one or more spacing elements arranged between the light source and the sensing element, at least one of the one or more spacing elements comprising a first pressure sensitive adhesive (PSA) layer having a thickness between 25 and 150 μm, the first PSA layer being grey or black in color and having a light reflectance below 10%.

22. The display apparatus of claim 21, wherein the one or more spacing elements further comprise:

a second PSA layer; and a polymer-based spacing element disposed between the first PSA layer and the second PSA layer, wherein the thickness of the polymer-based spacing element is between 25 and 300 μm.

23. The display apparatus of claim 22, wherein a thickness of the polymer-based spacing element is between 150 and 200 μm.

24. The display apparatus of claim 21, wherein the one or more spacing elements further comprise:

a second PSA layer; and a metallic layer disposed between the first PSA layer and the second PSA layer, wherein a material of the metallic layer comprises copper;

wherein each of the first PSA layer and the second PSA layer comprises a thickness between 3 and 15 μm, and the metallic layer comprises a thickness between 6 to 50 μm.

25. The display apparatus of claim 24, wherein the thickness of the metallic layer is between 6 and 15 μm.

26. The display apparatus of claim 21, wherein the light reflectance below 10% is effectuated by usage of a black dye, a black powder, or a black paint applied to the first PSA layer.

27. The display apparatus of claim 21, further comprising at least another one of the one or more spacing elements other than the first PSA layer, wherein a thickness of the at least another one of the one or more spacing elements other than the first PSA layer is up to 300 μm.

28. The display apparatus of claim 21, wherein the at least another one of the one or more spacing elements other than the first PSA layer comprises polyimide (PI), polycarbonate (PC), polystyrene (PS), polyethylene (PE), polyethylene terephthalate (PET), carbon fiber-reinforced plastic (CFRP), glass, ceramic, a metal, or a combination thereof.

29. The display apparatus of claim 21, wherein:

the light source comprises a Color Filter on Encapsulation organic light-emitting diode (COE OLED); and the at least another one of the one or more spacing elements other than the first PSA layer comprises a polarizer layer configured to be used with the COE OLED.

* * * * *